(12) United States Patent
Sashida et al.

(10) Patent No.: US 11,280,812 B2
(45) Date of Patent: Mar. 22, 2022

(54) SEMICONDUCTOR DEVICE AND SEMICONDUCTOR COMPONENT

(71) Applicant: SHINDENGEN ELECTRIC MANUFACTURING CO., LTD., Tokyo (JP)

(72) Inventors: Kazuyuki Sashida, Hanno (JP); Mizue Yamaji, Hanno (JP); Kenichi Suzuki, Hanno (JP); Kenichi Yoshida, Hanno (JP); Shinji Kunori, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 417 days.

(21) Appl. No.: 16/494,218

(22) PCT Filed: Nov. 24, 2017

(86) PCT No.: PCT/JP2017/042133
§ 371 (c)(1),
(2) Date: Sep. 13, 2019

(87) PCT Pub. No.: WO2019/102572
PCT Pub. Date: May 31, 2019

(65) Prior Publication Data
US 2021/0123953 A1  Apr. 29, 2021

(51) Int. Cl.
*G01R 15/18* (2006.01)
*G01R 19/00* (2006.01)
(Continued)

(52) U.S. Cl.
CPC ....... *G01R 15/181* (2013.01); *G01R 19/0092* (2013.01); *H01L 29/7815* (2013.01); *H01L 27/0629* (2013.01)

(58) Field of Classification Search
CPC .............. G01R 15/181; G01R 19/0092; H01L 29/7815; H01L 27/0629
See application file for complete search history.

(56) References Cited

U.S. PATENT DOCUMENTS 7,106,162 B2   9/2006  Saito
8,783,577 B2 * 7/2014  Suzuki .................... H01L 23/66
                                                          235/492
(Continued)

FOREIGN PATENT DOCUMENTS

JP         10247718 A    9/1998
JP       2002005966 A    1/2002
(Continued)

OTHER PUBLICATIONS

Gerber et al., "Gate Unit with Improved Short-Circuit Detection and Turn-Off Capability for 4.5-kV Press-Pack IGBTs Operated at 4-kA Pulse Current", IEEE Transactions on Plasma Science, vol. 41, No. 10, Oct. 2013, pp. 2641-2648.
(Continued)

*Primary Examiner* — Dominic E Hawkins
(74) *Attorney, Agent, or Firm* — Ladas & Parry, LLP

(57) ABSTRACT

A semiconductor device has a first electrode 61; a second electrode 62; and a semiconductor layer 1 having a winding wire part 10 provided so as to surround a current flowing between the first electrode 61 and the second electrode 62, a winding return wire part, which is provided so as to surround the current, is connected to a terminal end part of the winding wire part 10 and returns toward a starting end part side from the terminal end part, and an integration circuit configuration part connected to the winding wire part 10 or the winding return wire part. The integration circuit configuration part has one or more of a resistance part 115, a capacitor part 125 and an operational amplifier part 135.

7 Claims, 22 Drawing Sheets

(51) Int. Cl.
*H01L 29/78* (2006.01)
*H01L 27/06* (2006.01)

(56) References Cited

U.S. PATENT DOCUMENTS

| | | |
|---|---|---|
| 2003/0214313 A1 | 11/2003 | Omura et al. |
| 2004/0178875 A1 | 9/2004 | Saito |
| 2012/0098556 A1 | 4/2012 | Miyazaki |
| 2014/0167740 A1 | 6/2014 | Gilbert |
| 2014/0210463 A1* | 7/2014 | Klein .................. G01R 33/05 324/253 |
| 2015/0369845 A1 | 12/2015 | Salles et al. |
| 2019/0311835 A1* | 10/2019 | Miller .................. H01F 27/24 |

FOREIGN PATENT DOCUMENTS

| | | |
|---|---|---|
| JP | 2002221538 A | 8/2002 |
| JP | 2004119926 A | 4/2004 |
| JP | 2006196778 A | 7/2006 |
| JP | 2012088224 A | 5/2012 |
| JP | 2012088318 A | 5/2012 |
| KR | 101127478 B1 | 3/2012 |
| WO | 2006059218 A2 | 6/2006 |

OTHER PUBLICATIONS

Extended European Search Report from EP app. No. 17933113.7, dated May 17, 2021.
International Search Report in the international application No. PCT/JP2017/042133, dated Feb. 13, 2018.
Written Opinion of the International Search Authority in the international application No. PCT/JP2017/042133, dated Feb. 13, 2018 and English translation provided by Google translate.
International Preliminary Report on Patentability in the international application No. PCT/JP2017/042133, dated May 18, 2018 and English translation provided by Google translate.

* cited by examiner

FIG.4
(a)
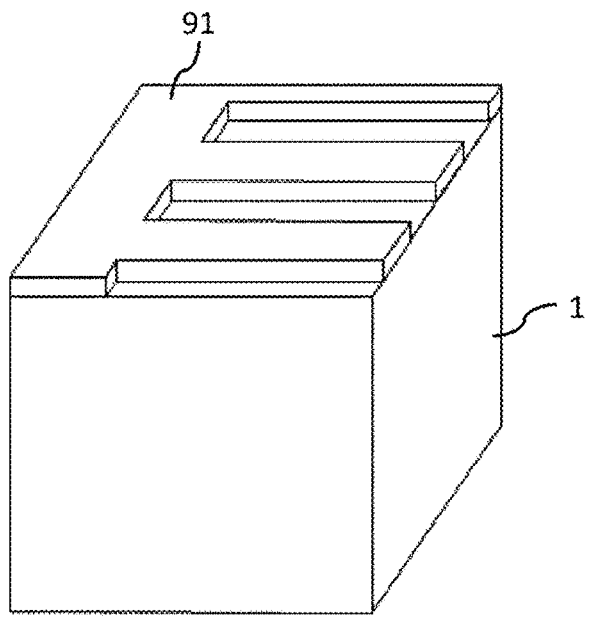
(b)
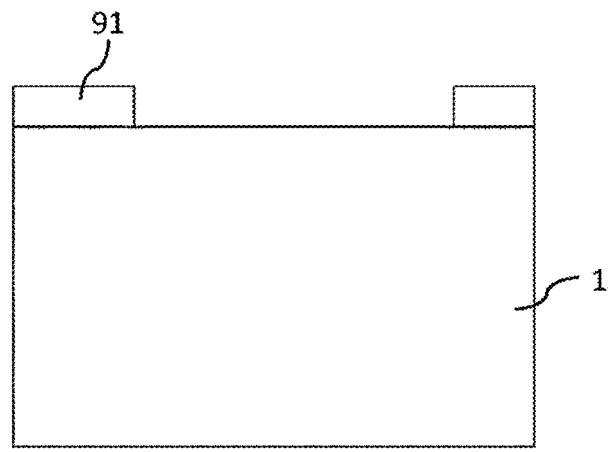
(c)
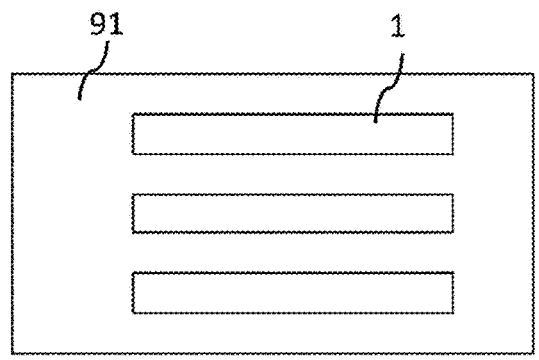

FIG.5
(a)
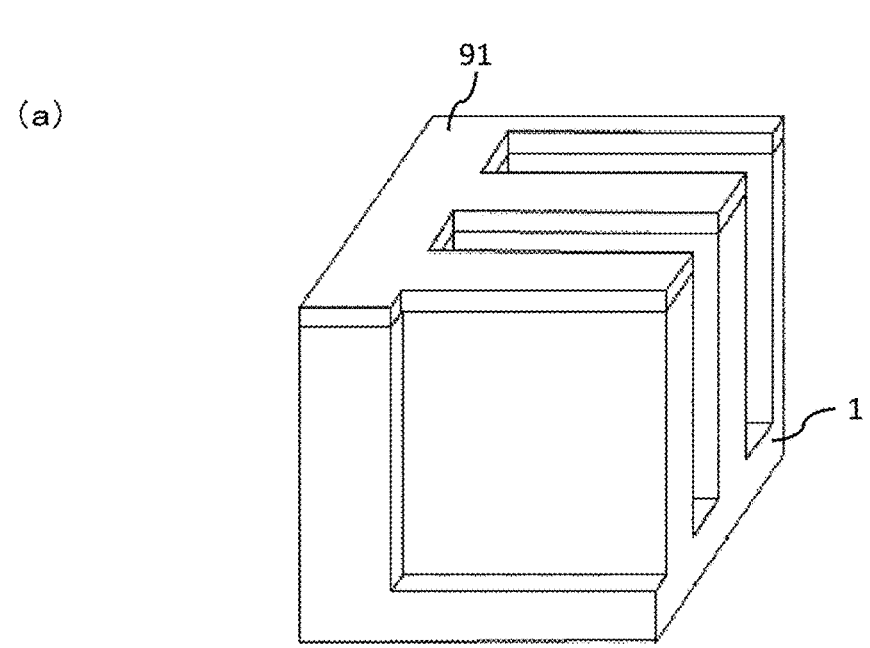
(b)
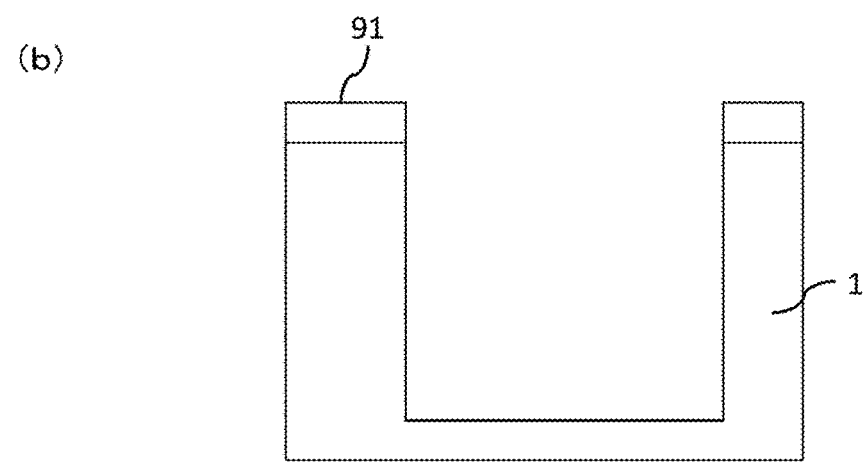
(c)
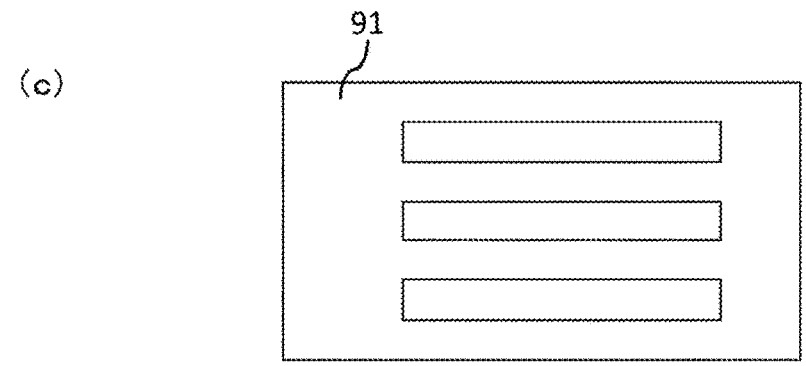

FIG.6
(a)
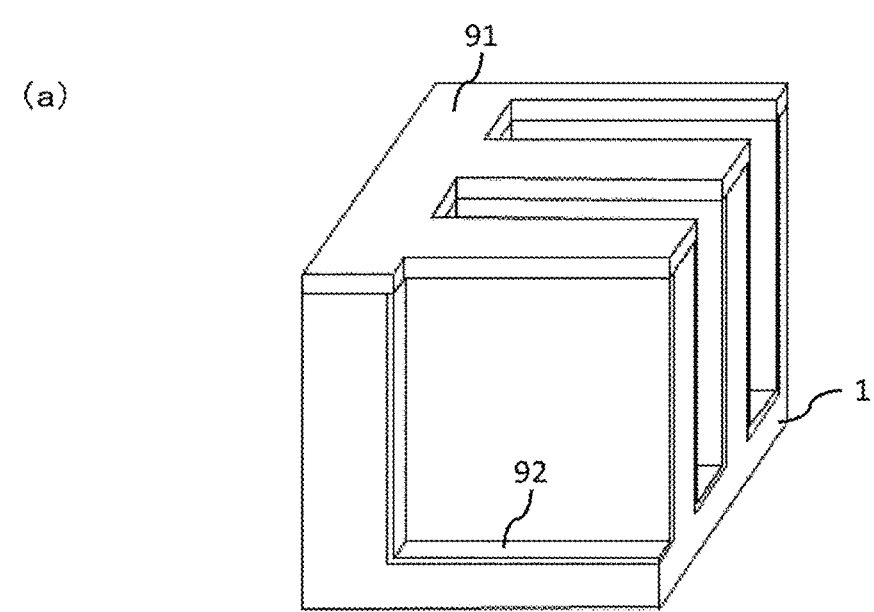
(b)
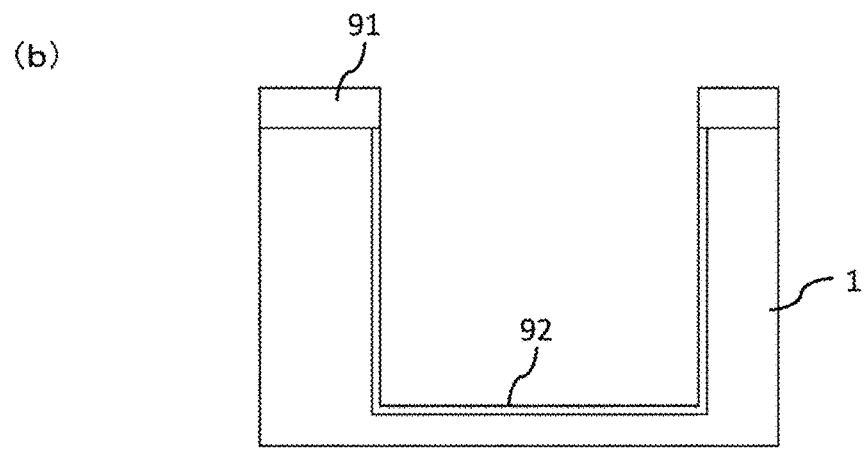
(c)
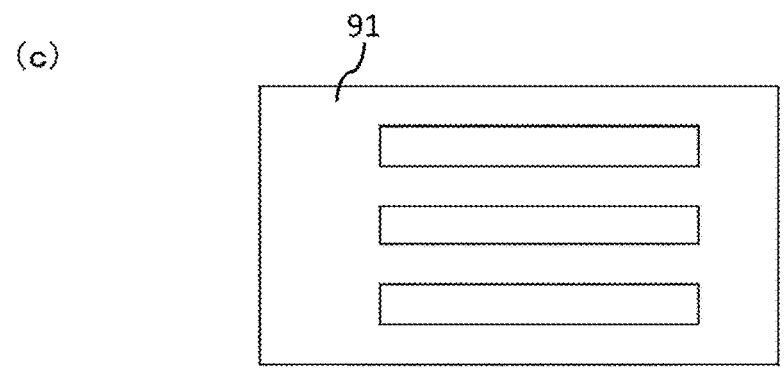

FIG.7
(a)
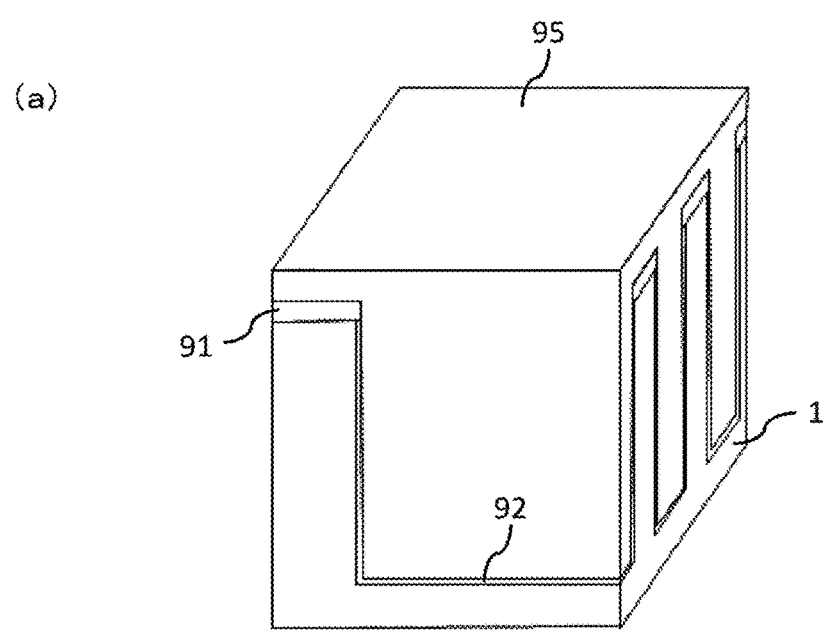
(b)
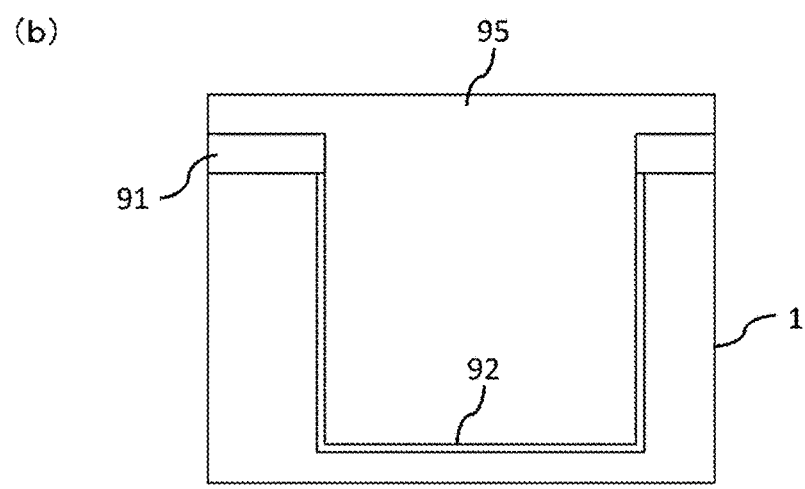
(c)
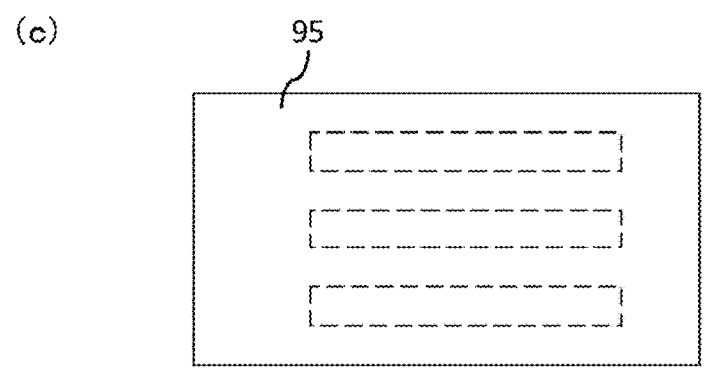

FIG.8
(a)
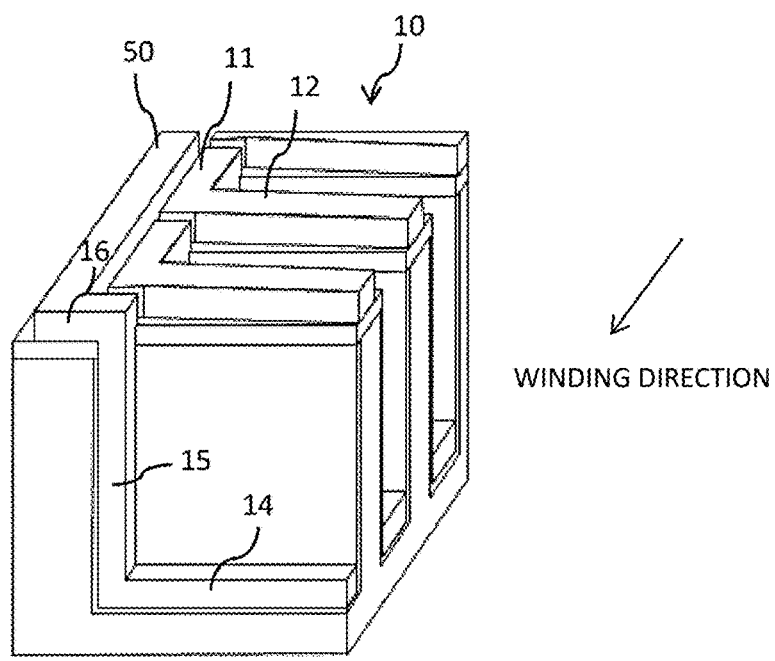
WINDING DIRECTION
(b)
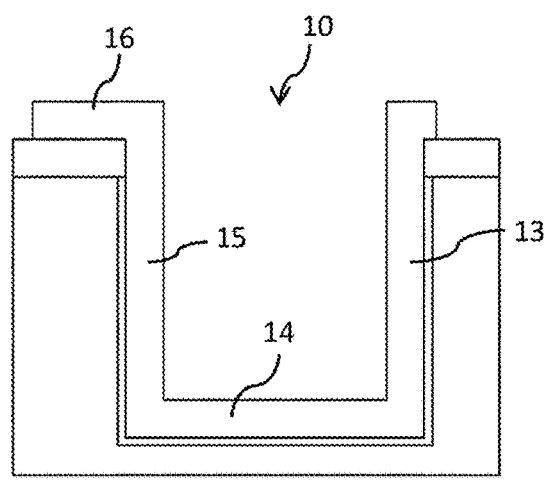
(c)
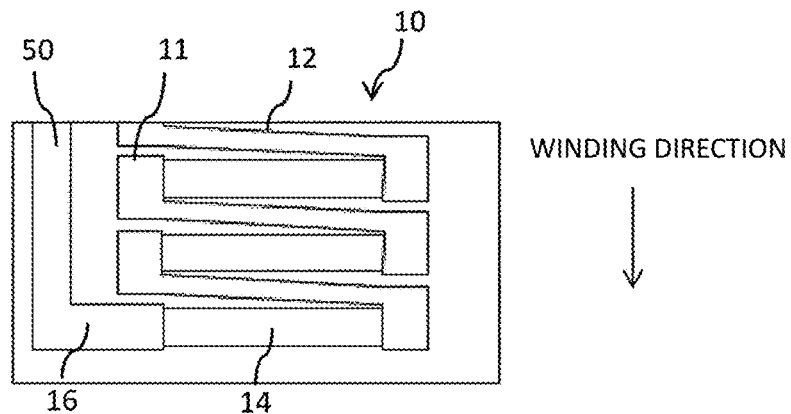
WINDING DIRECTION FIG.16
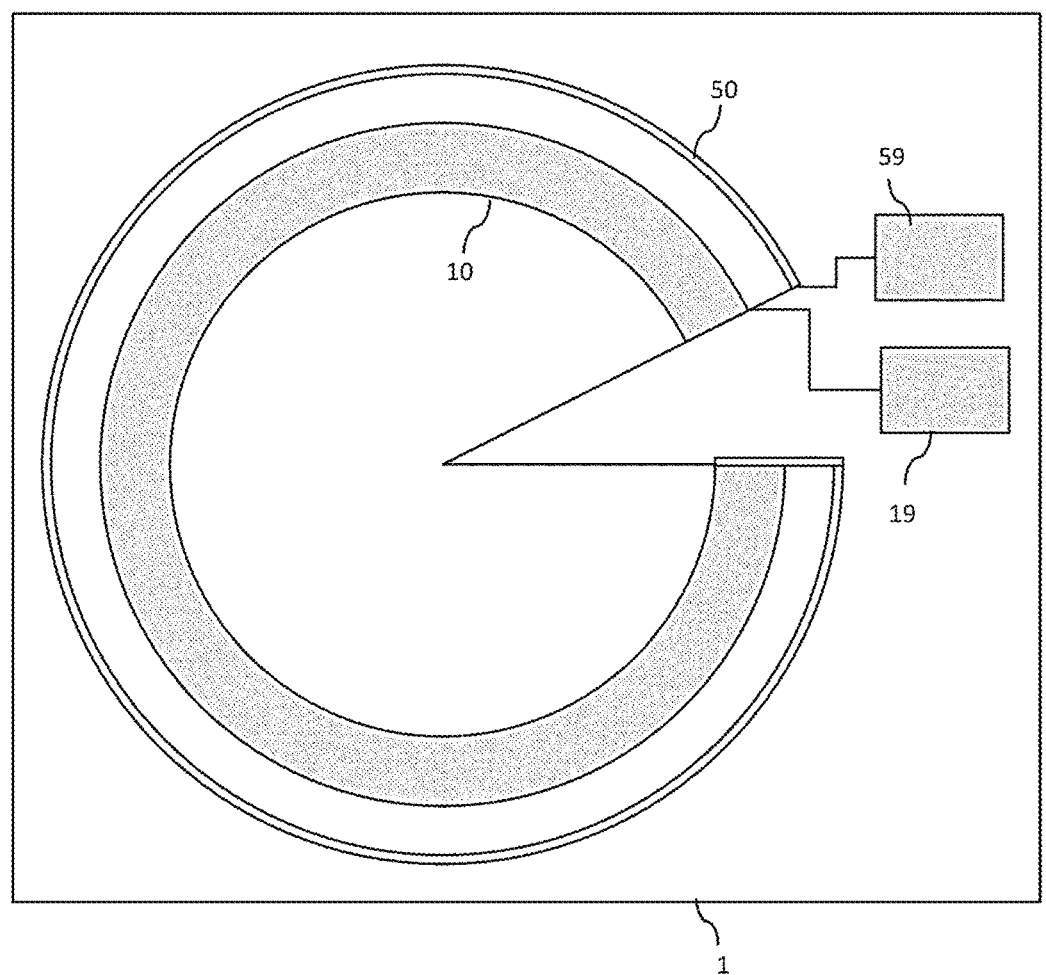
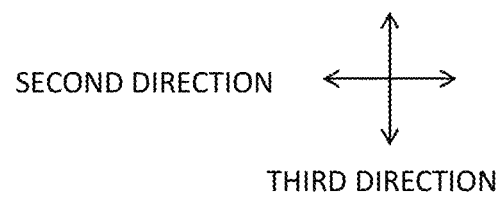

FIG.17
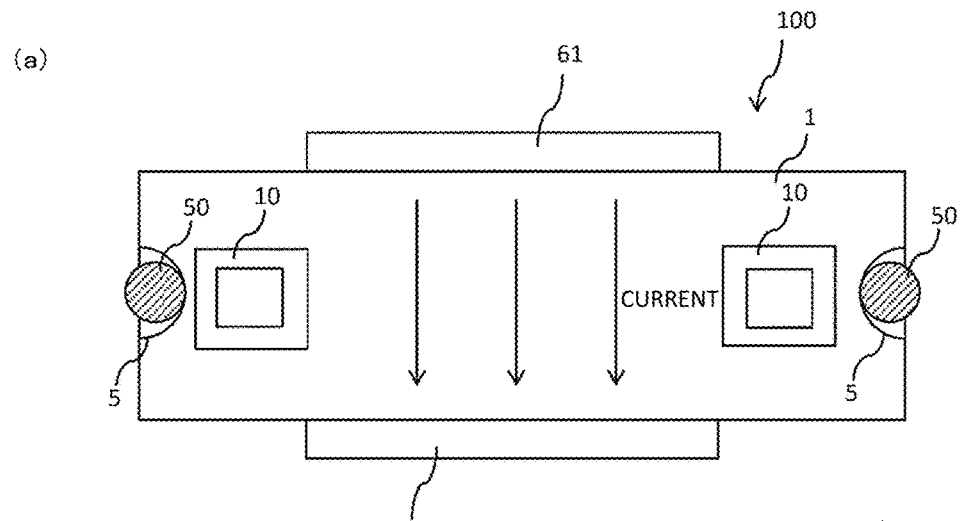
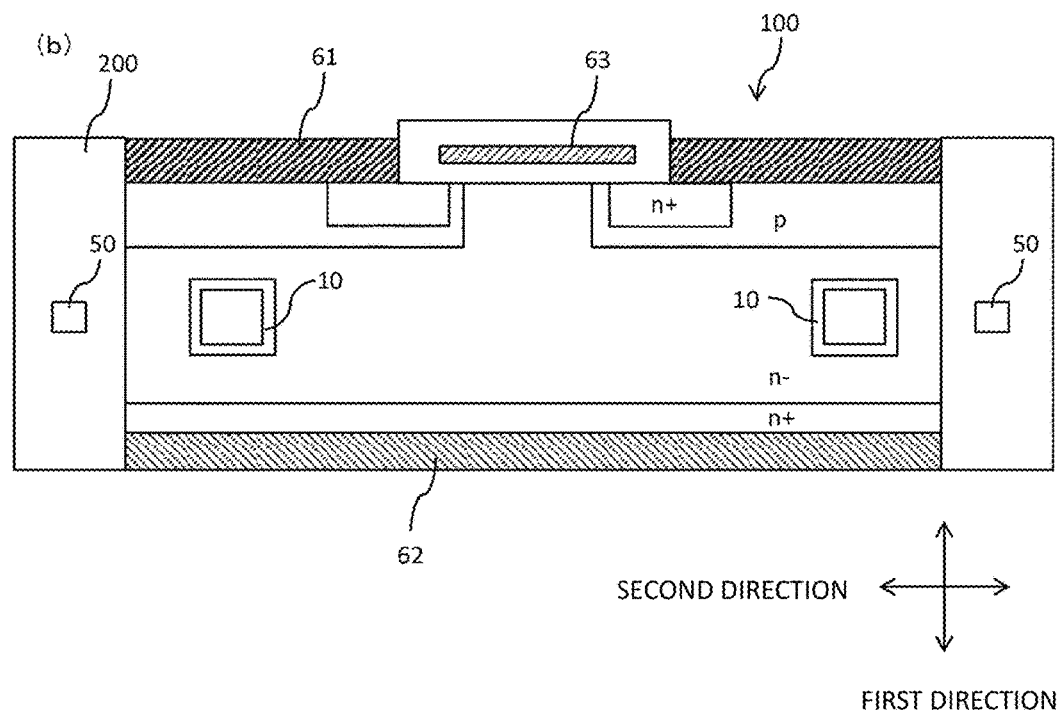

FIG.21
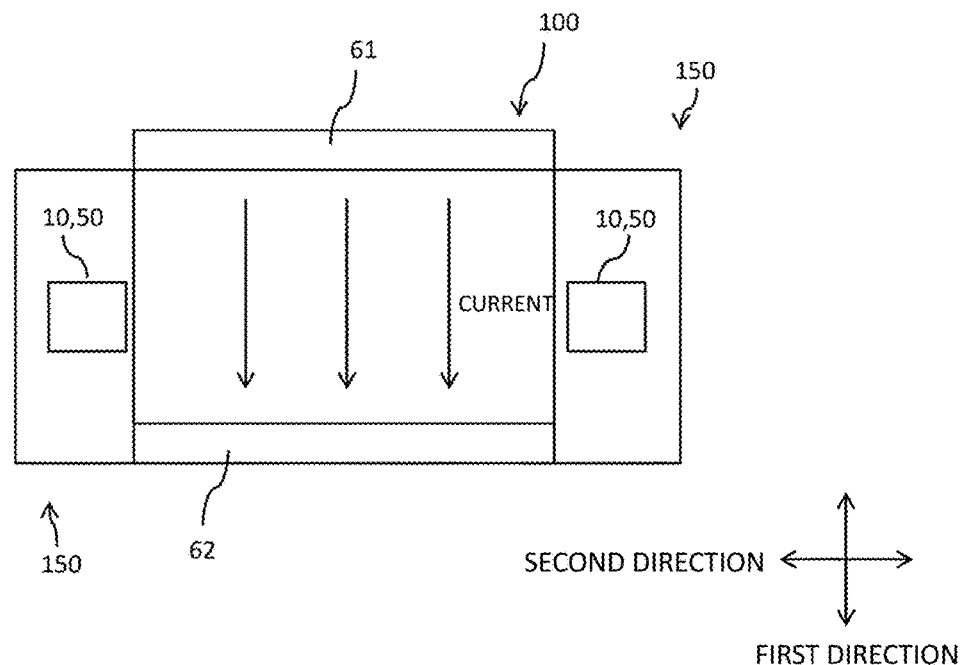
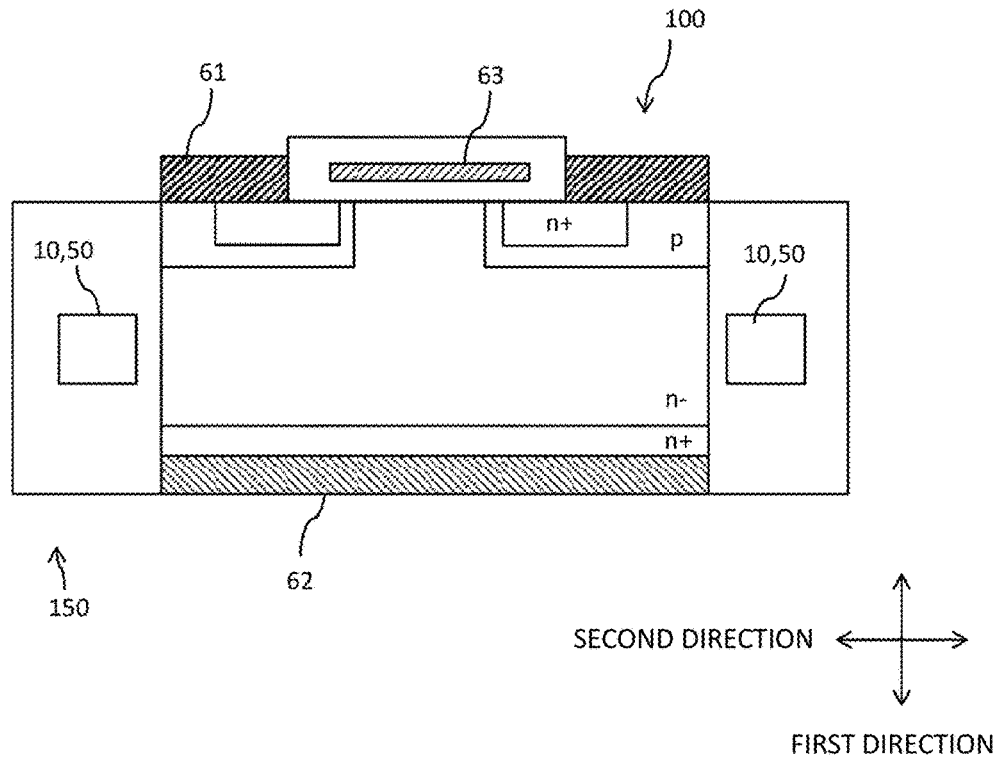

SEMICONDUCTOR DEVICE AND SEMICONDUCTOR COMPONENT

CROSS-REFERENCE TO RELATED APPLICATION

The present application is the U.S. national phase of PCT Application PCT/JP2017/042133 filed on Nov. 24, 2017, the disclosure of which is incorporated herein by reference in its entirety.

TECHNICAL FIELD

The present invention relates to a semiconductor device and a semiconductor component having a winding wire part in a semiconductor layer.

BACKGROUND ART

Conventionally, a current detection sensor using a Rogowski coil has been known. The Rogowski coil is a coreless coil, and has a winding core, a winding wire wound around the winding core, and a return wire connected to the terminal end part of the winding wire and returning to a starting end part side (for example, see JP 2012-88224 A). In addition, the Rogowski coil is connected to an integrator, and a change in current in an object to be measured can be measured by integrating the output voltage with the integrator. In such a Rogowski coil, the sensitivity is increased with an increase in the number of turns per unit distance.

Meanwhile, a sensor has been proposed which detects a change in current flowing through a semiconductor device (for example, a switching element). However, conventional sensors cannot detect a change in current flowing through the semiconductor device with sufficient accuracy, and there is a problem that the size of the entire device including the sensor may be increased.

SUMMARY OF INVENTION

Technical Problem

The present invention provides a semiconductor device and a semiconductor component which can be reduced in overall size and which can detect operation with high accuracy.

Solution to Problem

A semiconductor device may comprise:
a first electrode;
a second electrode; and
a semiconductor layer having a winding wire part provided so as to surround a current flowing between the first electrode and the second electrode, a winding return wire part which is provided so as to surround the current, is connected to a terminal end part of the winding wire part and returns toward a starting end part side from the terminal end part, and an integration circuit configuration part connected to the winding wire part or the winding return wire part; wherein
the integration circuit configuration part may have one or more of a resistance part, a capacitor part and an operational amplifier part,
the resistance part may be electrically connected to the winding wire part or the winding return wire part,
the capacitor part may be electrically connected to the resistance part or a resistor provided outside, and
the operational amplifier part may be electrically connected to the resistance part or a resistor provided outside, and the capacitor part or a capacitor provided outside.

In the semiconductor device according to the present invention,
the integration circuit configuration part may have the resistance part.

In the semiconductor device according to the present invention,
the integration circuit configuration part may have the capacitor part.

In the semiconductor device according to the present invention,
the integration circuit configuration part may have the resistance part and the capacitor part, and
the resistance part and the capacitor part may be electrically connected to an operational amplifier provided outside.

In the semiconductor device according to the present invention,
the integration circuit configuration part may have the resistance part, the capacitor part and the operational amplifier part.

In the semiconductor device according to the present invention,
the winding return wire part may not pass through the winding wire part.

A semiconductor component may comprise a semiconductor layer, wherein
the semiconductor layer may have
a winding wire part provided so as to surround a current;
a winding return wire part which is provided so as to surround the current, is connected to a terminal end part of the winding wire part and returns toward a starting end part side from the terminal end part; and
an integration circuit configuration part connected to the winding wire part or the winding return wire part;
the integration circuit configuration part may have one or more of a resistance part, a capacitor part and an operational amplifier part,
the resistance part may be electrically connected to the winding wire part or the winding return wire part,
the capacitor part may be electrically connected to the resistance part or a resistor provided outside, and
the operational amplifier part may be electrically connected to the resistance part or a resistor provided outside, and the capacitor part or a capacitor provided outside.

Effects of Invention

Furthermore, according to one aspect of the present invention, at least a part of the integration circuit is formed in the semiconductor layer, so that the entire configuration can be made compact. In addition, at least a part of the integration circuit is disposed closer to the winding wire part, whereby generation of noise can be prevented.

BRIEF DESCRIPTION OF DRAWINGS

FIG. 3(a) does not illustrate the right part of the device shown in FIGS. 3(b) and 3(c) in order to show a longitudinal cross section different from that shown in FIG. 3(b).

FIG. 4(a) shows a perspective view for describing a manufacturing step of the semiconductor device that can be used in the first embodiment of the present invention, FIG. 4(b) is a longitudinal sectional view of the semiconductor device shown in FIG. 4(a), and FIG. 4(c) is a plan view of the semiconductor device shown in FIG. 4(a). FIG. 4(a) does not illustrate the right part of the device shown in FIGS. 4(b) and 4(c) in order to show a longitudinal cross section different from that shown in FIG. 4(b).

FIG. 5(a) shows a perspective view for describing a manufacturing step subsequent to the step in FIG. 4(a), FIG. 5(b) is a longitudinal sectional view of the semiconductor device shown in FIG. 5(a), and FIG. 5(c) is a plan view of the semiconductor device shown in FIG. 5(a).

FIG. 6(a) shows a perspective view for describing a manufacturing step subsequent to the step in FIG. 5(a), FIG. 6(b) is a longitudinal sectional view of the semiconductor device shown in FIG. 6(a), and FIG. 6(c) is a plan view of the semiconductor device shown in FIG. 6(a).

FIG. 7(a) shows a perspective view for describing a manufacturing step subsequent to the step in FIG. 6(a), FIG. 7(b) is a longitudinal sectional view of the semiconductor device shown in FIG. 7(a), and FIG. 7(c) is a plan view of the semiconductor device shown in FIG. 7(a).

FIG. 8(a) shows a perspective view for describing a manufacturing step subsequent to the step in FIG. 7(a), FIG. 8(b) is a longitudinal sectional view of the semiconductor device shown in FIG. 8(a), and FIG. 8(c) is a plan view of the semiconductor device shown in FIG. 8(a).

FIG. 16 is a plan view of a semiconductor device that can be used in a fifth embodiment of the present invention.

FIG. 17(a) shows a longitudinal cross section of a semiconductor device that can be used in a sixth embodiment of the present invention, and FIG. 17(b) shows a longitudinal cross section of another semiconductor device that can be used in the sixth embodiment of the present invention.

FIG. 21(a) shows longitudinal cross sections of a semiconductor component and a semiconductor device that can be used in an eighth embodiment of the present invention, and FIG. 21(b) shows longitudinal cross sections of a semiconductor component and a semiconductor device that can be used in another aspect of the eighth embodiment of the present invention.

DESCRIPTION OF EMBODIMENTS

First Embodiment

«Configuration»

Figure 2:
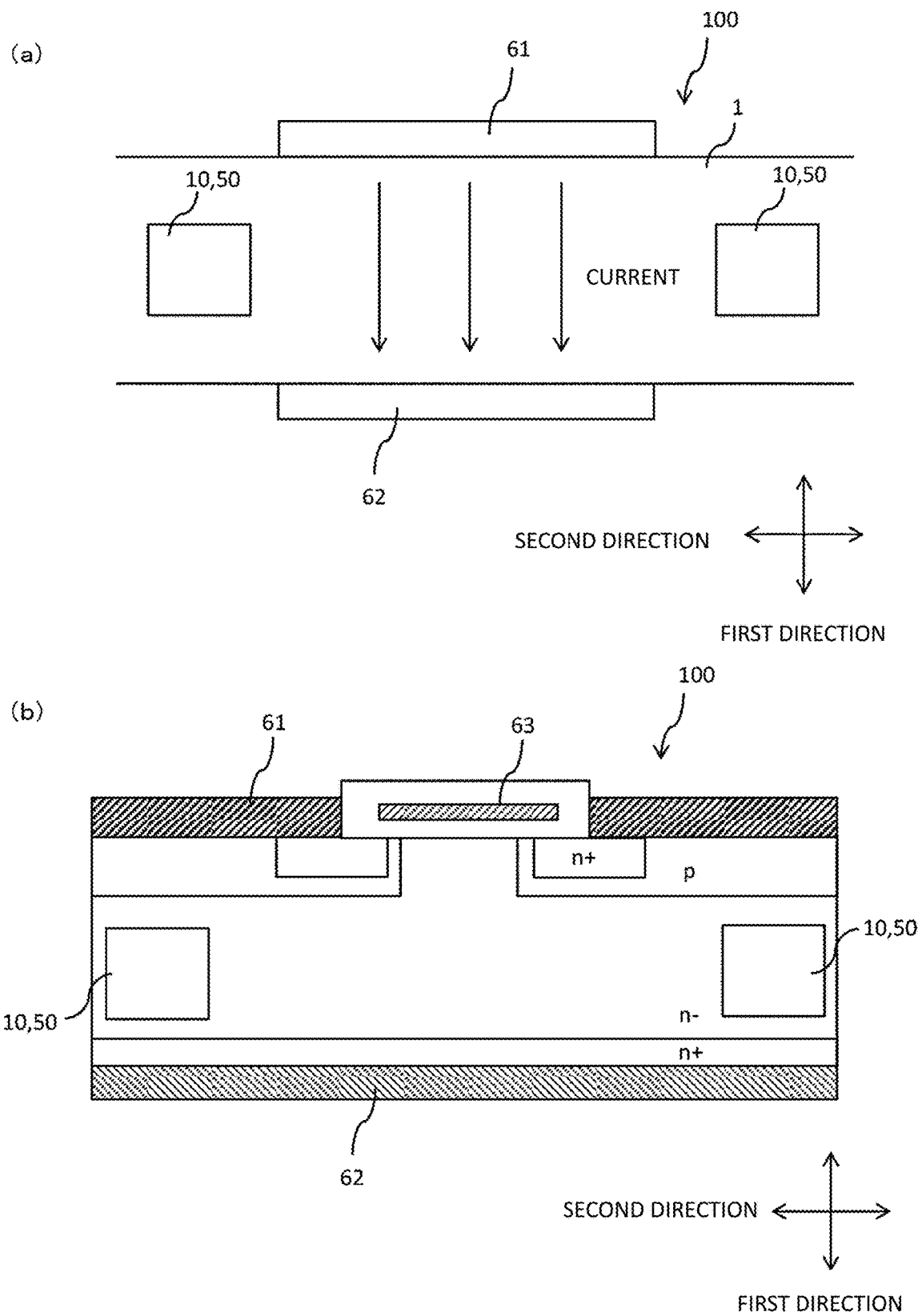
FIG. 2(a) shows a longitudinal cross section of the semiconductor device that can be used in the first embodiment of the present invention.
FIG. 2(b) shows a longitudinal cross section of another semiconductor device that can be used in the first embodiment of the present invention.

In the present embodiment, "one side" means the upper side in FIG. 2 and "other side" means the lower side in FIG. 2. Further, the vertical direction in FIG. 2 (the direction toward one side from the other side and the direction from one side toward the other side) is referred to as a "first direction", the horizontal direction in FIG. 2 is referred to as a "second direction", and the front-back direction of the page of FIG. 2 is referred to as a "third direction". An in-plane direction including the second direction and the third direction is referred to as a "plane direction", and a state where the device is viewed from the upper side in FIG. 2 is referred to as a "plan view".

As shown in FIG. 2(a), a semiconductor device 100 according to the present embodiment may have a first electrode 61; a second electrode 62; and a semiconductor layer 1 (see also FIG. 1) including a winding wire part 10 provided so as to surround a current flowing between the first electrode 61 and the second electrode 62, and a winding return wire part 50, which is provided so as to surround the current, is connected to the terminal end part of the winding wire part 10 and returns toward the starting end part side from the terminal end part. Examples of usable materials for the semiconductor include silicon, silicon carbide, and gallium nitride. FIG. 2(a) shows an aspect in which the current flows from the upper side toward the lower side. However, this is merely an example, and the current may flow from the lower side toward the upper side.

The winding wire part 10 and the winding return wire part 50 may be formed of a semiconductor material such as polysilicon, but not limited thereto. They may be formed of a metal material such as copper and aluminum, and the metal film may serve as the winding wire part 10 and the winding return wire part 50.

Figure 1:
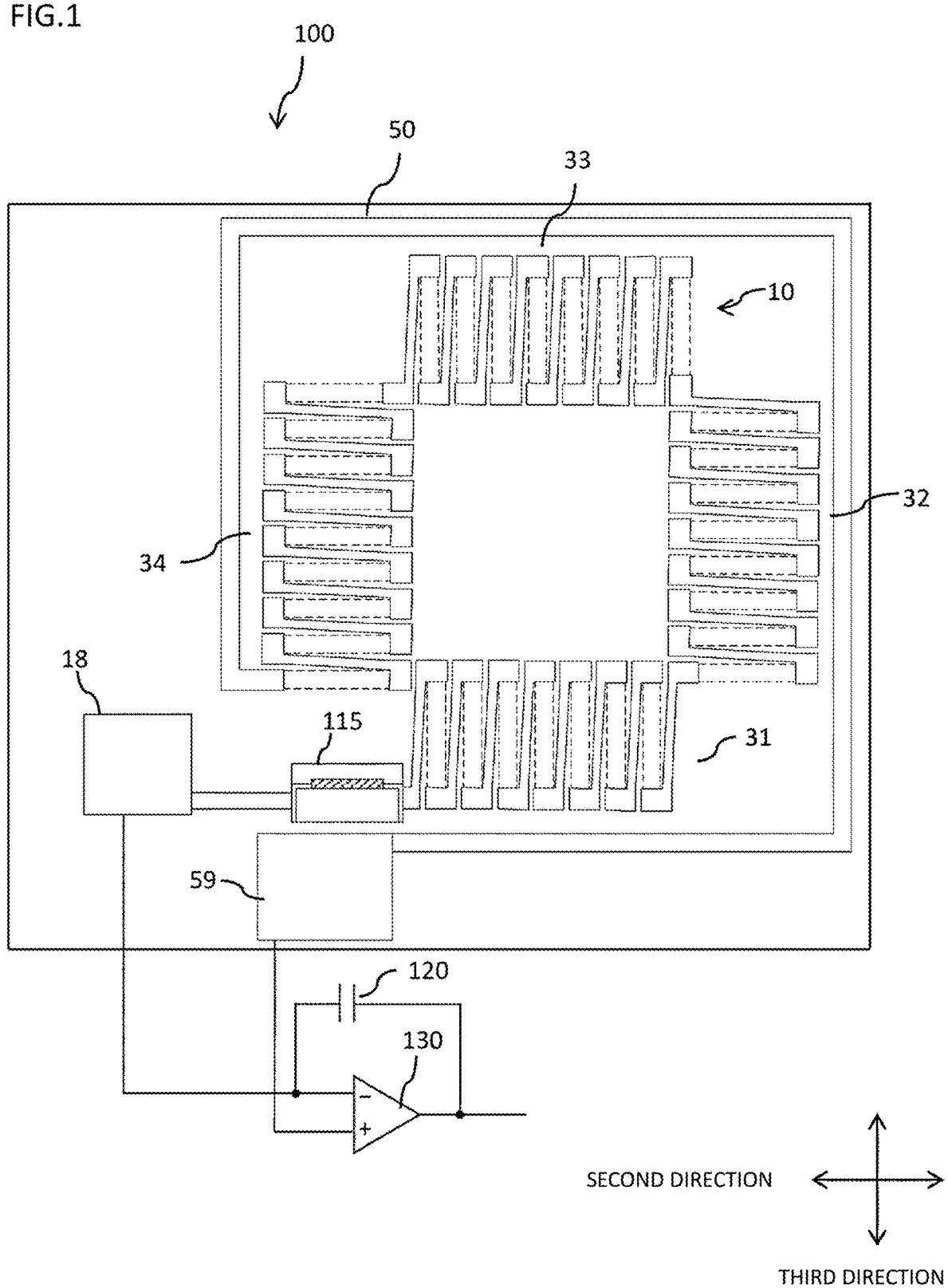
FIG. 1 is a plan view of a semiconductor device that can be used in a first embodiment of the present invention.

The winding return wire part 50 may be configured not to pass through the winding wire part 10. In the present embodiment, the winding return wire part 50 is provided to surround the outer periphery of the winding wire part 10 as shown in FIG. 1. The inside of the winding wire part 10 may be filled with an insulating material such as an oxide film (see a later-described third insulating film 93 shown in FIG. 3).

Figure 9:
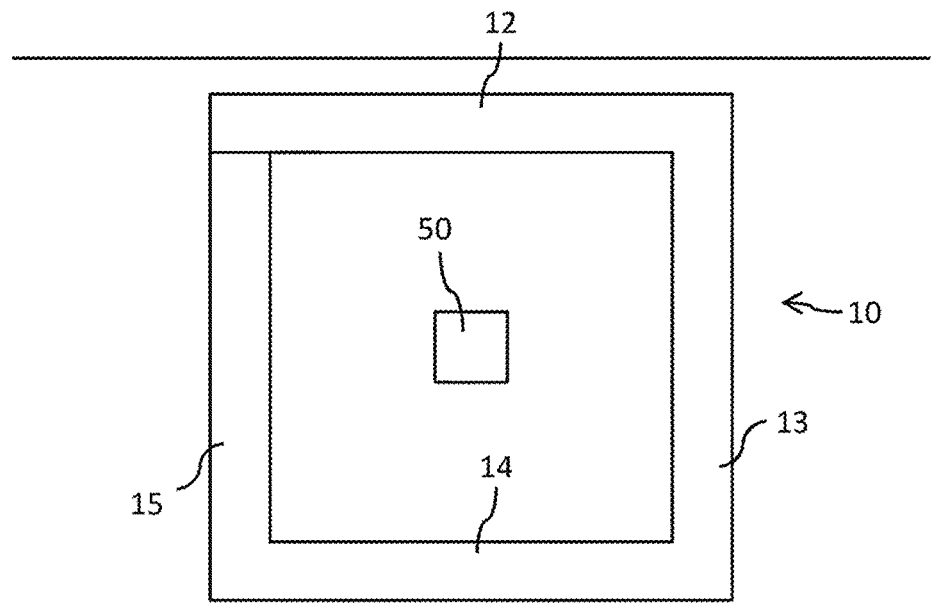
FIG. 9 is a longitudinal sectional view of still another semiconductor device that can be used in the first embodiment of the present invention. In order to show that a winding return wire part passes through a winding wire part, FIG. 9 also shows a second straight part on the front surface side of the page which is invisible in the longitudinal cross section.

Although FIG. 1 shows the aspect in which the winding return wire part 50 does not pass through the winding wire part 10, the present invention is not limited thereto, and the winding return wire part 50 may pass through the winding wire part 10 as shown in FIG. 9. In the present embodiment, the aspect shown in FIG. 1 is referred to as a "quasi Rogowski coil", and the aspect shown in FIG. 9 is referred to as a "Rogowski coil". Use of reference numerals "10, 50" in FIG. 2 indicates that the quasi Rogowski coil may be used or the Rogowski coil may be used.

Figure 3:
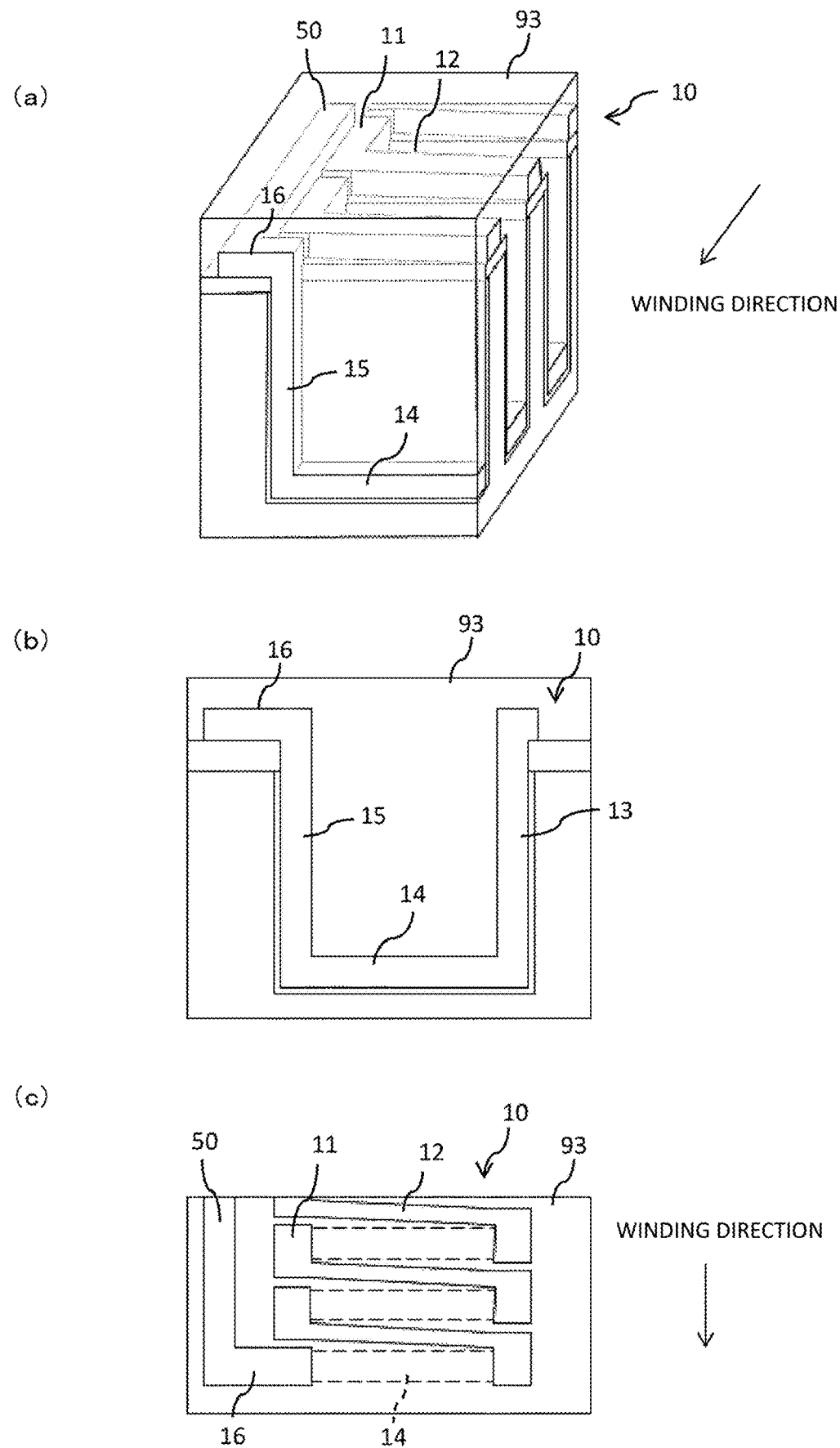
FIG. 3(a) shows a perspective view of the semiconductor device that can be used in the first embodiment of the present invention.
FIG. 3(b) is a longitudinal sectional view of the semiconductor device shown in FIG. 3(a)
FIG. 3(c) is a plan view of the semiconductor device shown in FIG. 3(a).

As shown in FIG. 3, the winding wire part 10 may have: a first straight part 11 along a winding direction; a second straight part 12 extending toward the inner peripheral edge (to the right in FIG. 3) from the end of the first straight part 11 and extending in a plane direction (direction including the second direction and the third direction) along the winding direction; a third straight part 13 extending from one side toward the other side from the end of the second straight part 12; a fourth straight part 14 extending toward the outer peripheral edge (to the left side in FIG. 3) from the end of the third straight part 13 and extending in the plane direction along the direction perpendicular to the winding direction; and a fifth straight part 15 extending toward one side from the other side from the end of the fourth straight part 14 (first aspect). Further, a sixth straight part 16 extending toward the outer peripheral edge from the end of the fifth straight part 15 in the plane direction may be provided at the terminal end part of the winding wire part 10, and the end of the sixth straight part 16 and the starting end part of the winding return wire part 50 may be connected to each other. The winding return wire part 50 may extend in the plane direction.

Unlike the aspect described above, the winding wire part 10 may have: a first straight part 11 along a winding direction; a second straight part 12 extending toward the inner peripheral edge from the end of the first straight part 11 and extending in a plane direction along the winding direction; a third straight part 13 extending toward one side from the other side from the end of the second straight part 12; a fourth straight part 14 extending toward the outer peripheral edge from the end of the third straight part 13 and extending in the plane direction along the direction perpendicular to the winding direction; and a fifth straight part 15 extending from one side toward the other side from the end of the fourth straight part 14 (second aspect). Further, a sixth straight part 16 extending toward the outer peripheral edge from the end of the fifth straight part 15 in the plane direction may be provided at the terminal end part of the winding wire part 10, and the end of the sixth straight part 16 and the starting end part of the winding return wire part 50 may be connected to each other. The winding return wire part 50 may extend in the plane direction.

Considering that the manufacturing method to be described later is adopted, it is advantageous to use the first aspect described first instead of the second aspect described later, because the winding return wire part 50 can be positioned on one side, which leads to simplified manufacturing process.

The first electrode 61 may be provided on a first main surface, and the second electrode 62 may be provided on a second main surface. In FIG. 2, the upper surface is defined as the first main surface, and the lower surface is defined as the second main surface. The semiconductor device 100 may be a switching element, and may be, for example, a vertical MOSFET. When the aspect of the present embodiment is adopted for the vertical MOSFET, the first electrode 61 may be a source electrode and the second electrode 62 may be a drain electrode as shown in FIG. 2(b). A quasi Rogowski coil may be provided so as to surround the current flowing between the source electrode and the drain electrode. Note that reference numeral 63 in FIG. 2(b) denotes a gate electrode.

As shown in FIG. 1, a resistance part 115 may be provided in the semiconductor layer 1 in the present embodiment. The starting end part of the winding wire part 10 may be connected to the resistance part 115 formed in the semiconductor layer 1, and the resistance part 115 may be connected to a winding-wire-side electrode pad 18. The winding-wire-side electrode pad 18 may be connected to one end of a capacitor 120 provided outside and the inverting input terminal of an operational amplifier 130, and a return-wire electrode pad 59 connected to the terminal end part of the winding return wire part 50 may be connected to the non-inverting input terminal of the operational amplifier 130. The other end of the capacitor 120 may be connected to the output terminal of the operational amplifier 130. In FIG. 1, the resistance part 115 to be described later is schematically shown.

Figure 10:
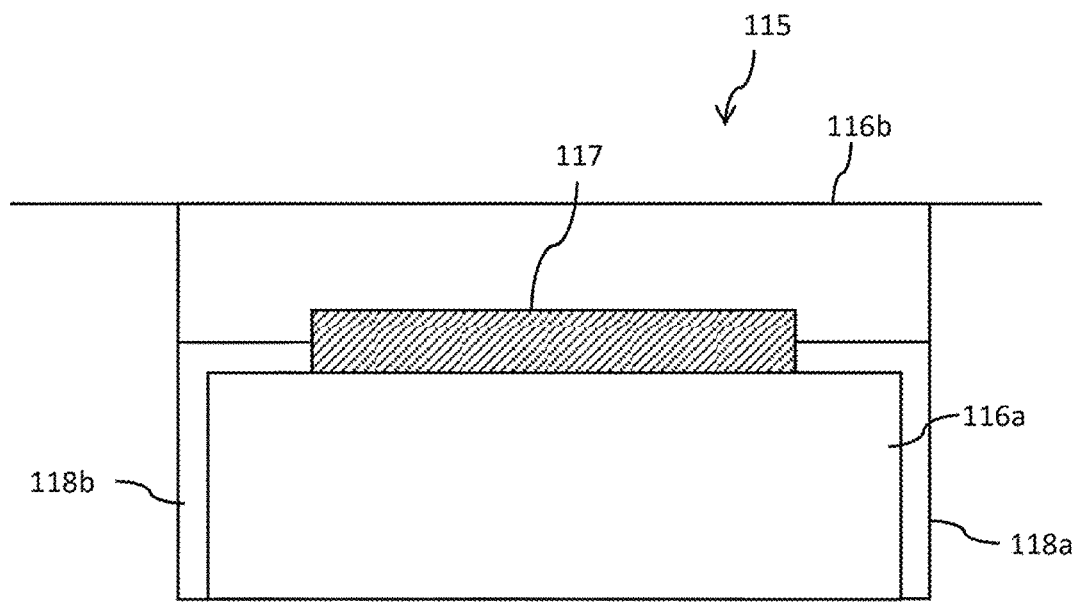
FIG. 10 is a longitudinal sectional view of a resistance part that can be used in the first embodiment of the present invention.

As shown in FIG. 10, the resistance part 115 may include a first resistance electrode part 118a connected to the winding wire part 10, a second resistance electrode part 118b connected to the winding-wire-side electrode pad 18, a resistance element 117 provided between the first resistance electrode part 118a and the second resistance electrode part 118b, and insulating layers 116a and 116b covering the resistance element 117. The first resistance electrode part 118a and the second resistance electrode part 118b may be made of polysilicon or the like. The resistance part 115 is not necessarily made of only a semiconductor material, and metal or an insulating material can also be used as appropriate. For example, the first resistance electrode part 118a and the second resistance electrode part 118b may be made of metal. The resistance element 117 may be made of, for example, ruthenium oxide or Ag/Pd. Note that, for example, a technique for producing a resistor 110 can be used for forming the resistance part 115. Further, the resistance of the resistance part 115 may be varied by adjusting the impurity concentration in the semiconductor layer 1.

As shown in FIG. 1, the winding wire part 10 may have an A-direction winding wire part 31 extending in the second direction, a B-direction winding wire part 32 connected to the end of the A-direction winding wire part 31 and extending in the third direction, a C-direction winding wire part 33 connected to the end of the B-direction winding wire part 32 and extending in the second direction, and a D-direction winding wire part 34 connected to the end of the C-direction winding wire part 33 and extending in the third direction. When the aspect described above is employed, the A- to D-direction winding wire parts 31 to 34 can be linearly formed, which is advantageous in that they can be manufactured relatively easily. The present embodiment describes the aspect using four direction winding wire parts 31 to 34. However, the present invention is not limited thereto, and three direction winding wire parts may be used to form a triangular shape in the plane direction, or five or more direction winding wire parts may be used to form a polygonal shape in the plane direction.

The A-direction winding wire part 31, the B-direction winding wire part 32, the C-direction winding wire part 33, and the D-direction winding wire part 34 may correspond to each other in length. The state where they correspond to each other in length indicates that the length of the A-direction winding wire part 31, the length of the B-direction winding wire part 32, the length of the C-direction winding wire part 33, and the length of the D-direction winding wire part 34 are respectively within the range of ±5% of the average value of the A-direction winding wire part 31, the B-direction winding wire part 32, the C-direction winding wire part 33, and the D-direction winding wire part 34. The numbers of turns included in the A-direction winding wire part 31, the B-direction winding wire part 32, the C-direction winding wire part 33, and the D-direction winding wire part 34 may be the same. The number of turns of the A-direction winding wire part 31 may be less than the numbers of turns of the B-direction winding wire part 32, the C-direction winding wire part 33, and the D-direction winding wire part 34 by, for example, one, two, or more.

In the above aspect, the linear part is described using a "straight part". That is, the aspect is described using the first straight part 11 as an example of the first linear part, the second straight part 12 as an example of the second linear part, the third straight part 13 as an example of the third linear part, the fourth straight part 14 as an example of the fourth linear part, the fifth straight part 15 as an example of the fifth linear part, and the sixth straight part 16 as an example of the sixth linear part. However, the present invention is not limited thereto. The respective linear parts may be curved, or only some of the plurality of linear parts may be straight parts. In view of facilitating the manufacturing process, it is advantageous that the second linear part and the fourth linear part are straight parts, that is, the second straight part 12 and the fourth straight part 14, respectively.

Further, in the above aspect, the longitudinal cross section has a rectangular shape by the second straight part 12, the third straight part 13, the fourth straight part 14, and the fifth straight part 15 (see FIGS. 3 and 9). However, the present invention is not limited thereto, and the longitudinal cross section may have a triangular shape or a polygonal shape (polygon having five or more corners) having more corners.

«Manufacturing Method»

Next, an example of a method for manufacturing the semiconductor device 100 according to the present embodiment will be described.

A first insulating film 91 made of an oxide film or the like is formed on the upper surface of the semiconductor layer 1 such as a wafer with a thermal oxide film or chemical vapor deposition (CVD) (see FIG. 4). Note that the first insulating film 91 also includes a resist film.

Next, a region for forming a trench is patterned by photolithography, and thereafter, the first insulating film 91 is dry etched (see FIG. 4).

Then, the semiconductor layer 1 is dry etched using the first insulating film 91 as a mask (see FIG. 5). The damaged layer on the etched side wall may be removed by chemical dry etching (CDE), sacrificial oxide film, $H_2$ annealing, or the like.

Next, a second insulating film 92 such as a thermal oxide film or a CVD oxide film is formed on the inner sidewall and the inner bottom surface of the trench (see FIG. 6). When the first insulating film 91 is composed of, for example, a resist film, the first insulating film 91 may be removed before the second insulating film 92 is formed, and then the second insulating film 92 may be formed, unlike the above aspect.

Then, the inside of the trench is filled with a conductive material 95 such as polysilicon, and the conductive material 95 such as polysilicon is also stacked on the upper surface of the first insulating film 91 (see FIG. 7). With this process, the conductive material 95 is provided inside the trench in which the second insulating film 92 is formed and on the first insulating film 91. In this case, the thickness of the conductive material 95 stacked on the first insulating film 91 may be, for example, about 0.5 µm to 2 µm.

Next, patterning for forming the winding wire part 10 and the winding return wire part 50 is performed by photolithography (see FIG. 8). In this process, the thickness of the conductive material 95 remaining on the inner bottom surface and the inner side surface of the trench may be the same as the thickness of the conductive material 95 stacked on the first insulating film 91, and may be, for example, about 0.5 µm to 2 µm. Due to forming the conductive materials 95 to have the same thickness as described above, the current flowing through the respective straight parts 11 to 16 and the winding return wire part 50 can be made constant, which is advantageous in that the detection accuracy can be enhanced.

Next, the inside of the trench is embedded with an insulating material such as an oxide film, and the insulating material is also stacked on the upper surface (see FIG. 3). More specifically, the third insulating film 93 such as an oxide film is embedded by CVD or spin on glass (SOG), and the third insulating film 93 such as an interlayer insulating film is provided on the upper surface.

Next, photolithography is performed to open a contact hole in the third insulating film 93 such as an interlayer insulating film at the starting end part of the winding wire part 10 and the terminal end part of the winding return wire part 50 formed of the conductive material 95 such as polysilicon. Thereafter, a contact hole is opened in the third insulating film 93 such as an interlayer insulating film by dry etching, and metal to be a PAD for an electrode wire or the like is formed at the portion where the contact hole is opened, so as to form the winding-wire-side electrode pad 18 and the return-wire electrode pad 59 (see FIG. 1).

«Operation and Effect»

Subsequently, an example of the operation and effect according to the present embodiment configured as described above will be described. All the aspects to be described in "operation and effect" can be employed in the above configuration.

When the winding wire part 10 as in the present embodiment is adopted, the configuration of the winding wire part 10 can be miniaturized by utilizing the technique for manufacturing the semiconductor device 100, and the number of turns per unit length can be increased. Therefore, a change in current (the operation of the semiconductor device 100) can be detected accurately. Further, since miniaturization is enabled as described above, an increase in size of the semiconductor device 100 can be prevented, even if the winding wire part 10 and the winding return wire part 50 are provided in the semiconductor layer 1.

Further, the winding wire part 10 and the winding return wire part 50 are formed in the semiconductor layer 1 of the semiconductor device 100 in which the arrangement positions of the first electrode 61 and the second electrode 62 are determined as in the present embodiment, whereby the winding wire part 10 and the winding return wire part 50 can be positioned with respect to the current which is to be measured and which is flowing between the first electrode 61 and the second electrode 62. In addition, since no positional deviation occurs, there is no influence by the positional deviation. For this reason, it is possible to measure the change in current without variation.

The application of the aspect in which the winding return wire part 50 does not pass through the winding wire part 10 is significantly advantageous in that the manufacturing process can be facilitated. Specifically, when the aspect shown in FIG. 9 in which the winding return wire part 50 passes through the winding wire part 10 is employed, the process for forming the winding return wire part 50 inside the winding wire part 10 becomes complicated, which leads to an increase in manufacturing cost. On the other hand, when the winding return wire part 50 is not formed inside the winding wire part 10 as described with reference to FIGS. 3 to 8, the manufacturing process can be remarkably facilitated, and the manufacturing cost can be reduced. Thus, this aspect is advantageous.

In a case where the semiconductor device 100 is a switching element such as a MOSFET, a current changes when the device 100 is switched between ON and OFF. In view of this, the use of the quasi Rogowski coil and the Rogowski coil according to the present embodiment is advantageous.

As shown in FIG. 2, when the aspect in which the first electrode 61 is provided on the first main surface of the semiconductor layer 1 and the second electrode 62 is provided on the second main surface of the semiconductor layer 1 is used, a current flows between the first main surface and the second main surface, and the winding wire part 10 and the winding return wire part 50 are provided so as to surround the current. Therefore, the manufacturing method as described above (see FIGS. 3 to 8) can be used. Thus, the manufacturing process can be simplified, which is advantageous in that a practical manufacturing method can be established in consideration of mass production.

When the aspect in which the first straight part 11, the second straight part 12, and the sixth straight part 16 of the winding wire part 10 and the winding return wire part 50 are the same in height as shown in FIGS. 3(a) and 3(b), the same process can be used for these parts as shown in FIGS. 7 and 8, which is advantageous. That is, this aspect is advantageous in that these parts can be formed by stacking the conductive material 95 on the upper surface of the first insulating film 91 (see FIG. 7) and etching the conductive material 95 (see FIG. 8).

When the present embodiment is used, the winding return wire part 50 can be positioned outward of the periphery of the winding wire part 10. For this reason, the present embodiment is advantageous in that the winding wire part 10 can be disposed as close to the current flowing between the first electrode 61 and the second electrode 62 as possible.

In the present embodiment, the resistance part 115 connected to the capacitor 120 and the operational amplifier 130 is formed in the semiconductor layer 1 as shown in FIG. 1. Therefore, an integration circuit can be formed without separately using a resistor, and the like, which is advantageous. An aspect where the operational amplifier 130 is not used as the integration circuit is also considered, and in such a case, it is only necessary that the semiconductor device 100 of the present embodiment is connected to the capacitor 120.

In addition, due to the resistance part 115 being incorporated in the semiconductor layer 1, the size can be further reduced, and further, noise generated between the winding wire part 10 and the resistance part 115 can be suppressed.

In addition, the present embodiment is also advantageous in that, since the positional relationship between the resistance part 115 and the starting end part of the winding wire part 10 is determined in advance, generation of variation in accuracy in detecting a change in current, depending on the positional relationship and the connection mode between the resistance part 115 and the winding wire part 10, can be prevented.

Second Embodiment

Next, a second embodiment of the present invention will be described.

Figure 11:
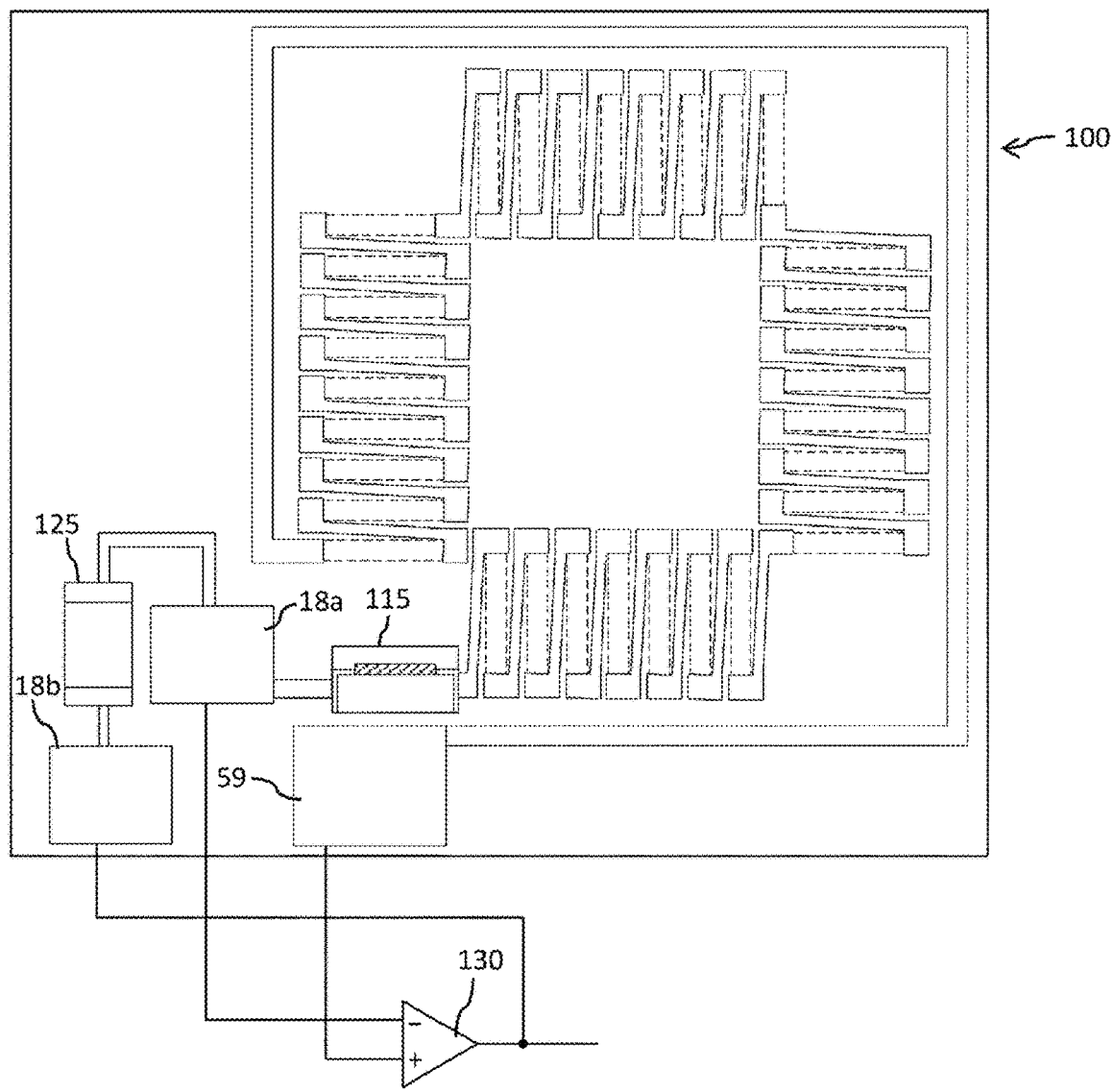
FIG. 11 is a plan view of a semiconductor device that can be used in a second embodiment of the present invention.
Figure 12:
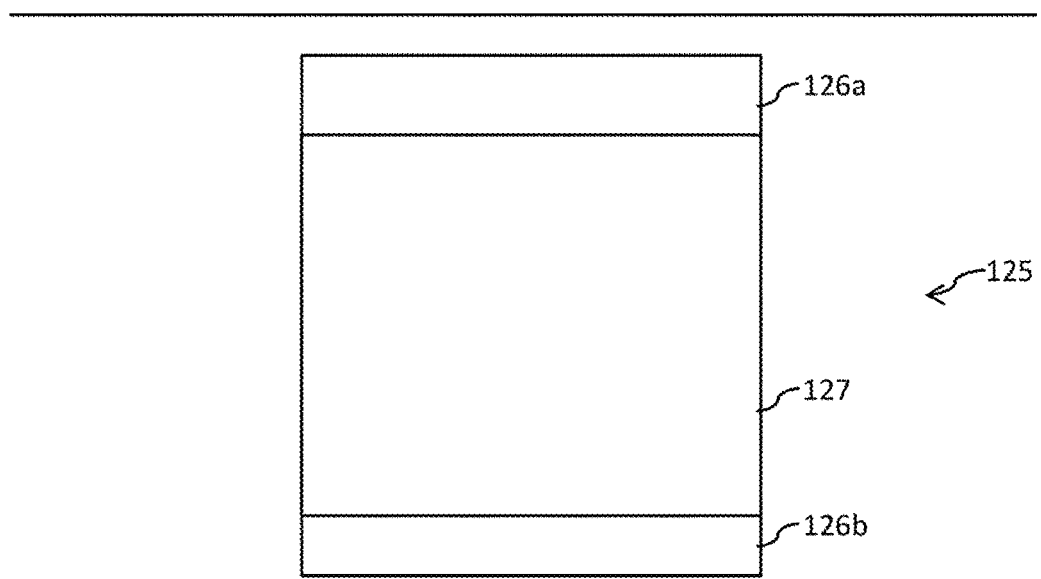
FIG. 12 is a longitudinal sectional view of a capacitor part that can be used in the second embodiment of the present invention.

In the first embodiment, the resistance part 115 is formed in the semiconductor layer 1. In contrast, in the present embodiment, a capacitor part 125 is formed in the semiconductor layer 1 in addition to the resistance part 115 as shown in FIG. 11. As shown in FIG. 12, the capacitor part 125 may include a first capacitor electrode part 126a connected to a first winding-wire-side electrode pad 18a, a second capacitor electrode part 126b connected to a second winding-wire-side electrode pad 18b, and an insulating layer 127 provided between the first capacitor electrode part 126a and the second capacitor electrode part 126b. As shown in FIG. 11, the first winding-wire-side electrode pad 18a may be connected to the resistance part 115 inside the semiconductor layer 1 and connected to the inverting input terminal of the operational amplifier 130 provided outside, and the second winding-wire-side electrode pad 18b may be connected to the output terminal of the operational amplifier 130. In FIG. 11, the capacitor part 125 is schematically shown. The other configurations are similar to those of the first embodiment, and any configurations adopted in the first embodiment can be adopted in the second embodiment. The members described in the first embodiment will be described with the same reference numerals.

The first capacitor electrode part 126a and the second capacitor electrode part 126b may be made of polysilicon or the like. The capacitor part 125 is not necessarily made of only a semiconductor material, and metal or an insulating material can also be used as appropriate. For example, the first capacitor electrode part 126a and the second capacitor electrode part 126b may be made of metal. A technique for forming a multilayer ceramic capacitor or a chip capacitor can also be used for forming the capacitor part 125, and a dielectric such as an insulating layer may be sandwiched between a plurality of metal layers or layers made of polysilicon to form a multilayer structure.

In the present embodiment, the resistance part 115 and the capacitor part 125 are formed in the semiconductor layer 1. Therefore, an integration circuit can be formed without separately using a resistor and a capacitor, which is advantageous.

In addition, due to the resistance part 115 and the capacitor part 125 being incorporated in the semiconductor layer 1, the size can be further reduced, and further, noise generated between the winding wire part 10 and the resistance part 115 and between the resistance part 115 and the capacitor part 125 can be suppressed.

In addition, the present embodiment is also advantageous in that, since the positional relationship between both the resistance part 115 and the capacitor part 125 and the starting end part of the winding wire part 10 is determined in advance, generation of variation in accuracy in detecting a change in current, depending on the positional relationship and the connection mode between both the resistance part 115 and the capacitor part 125 and the winding wire part 10, can be prevented.

Third Embodiment

Next, a third embodiment of the present invention will be described.

Figure 13:
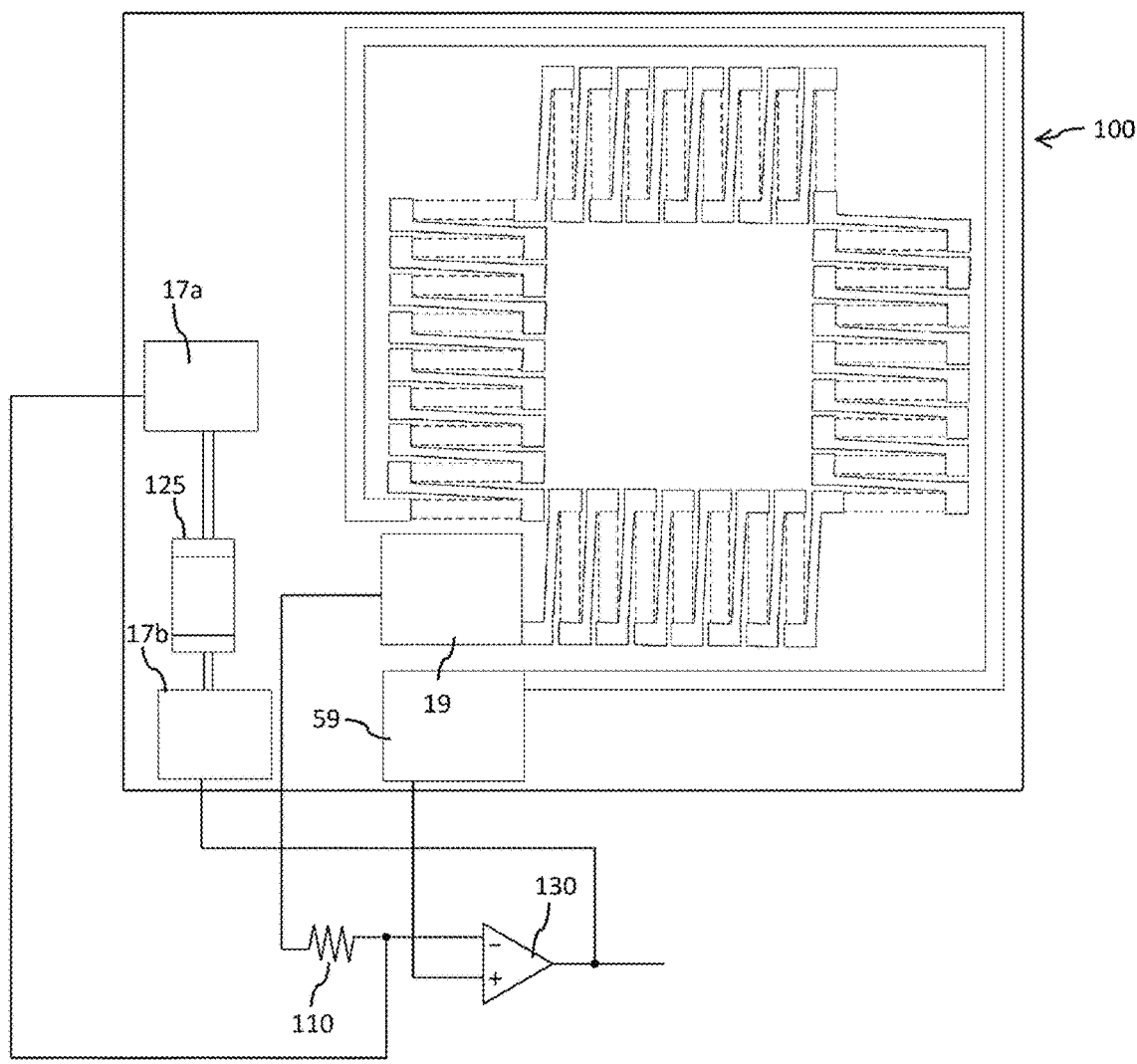
FIG. 13 is a plan view of a semiconductor device that can be used in a third embodiment of the present invention.

In the second embodiment, the resistance part 115 and the capacitor part 125 are formed in the semiconductor layer 1. In contrast, in the present embodiment, the capacitor part 125 is formed in the semiconductor layer 1, but the resistance part 115 is not formed, as shown in FIG. 13. For the other configurations, any configurations adopted in the above embodiments can be adopted. The members described in each of the above embodiments will be described with the same reference numerals.

The starting end part of the winding wire part 10 may be connected to a winding-wire electrode pad 19, and the winding-wire electrode pad 19 may be connected to one end of an externally provided resistor 110. The other end of the resistor 110 may be connected to a first capacitor electrode pad 17a and the inverting input terminal of the operational amplifier 130. A second capacitor electrode pad 17b may be connected to the output terminal of the operational amplifier 130. The first capacitor electrode pad 17a may be connected to the first capacitor electrode part 126a of the capacitor part 125, and the second capacitor electrode pad 17b may be connected to the second capacitor electrode part 126b of the capacitor part 125 (see FIG. 12).

In the present embodiment, the capacitor part 125 is formed in the semiconductor layer 1. Therefore, an integration circuit can be formed without separately using the capacitor 120, which is advantageous.

Fourth Embodiment

Next, a fourth embodiment of the present invention will be described.

Figure 15:
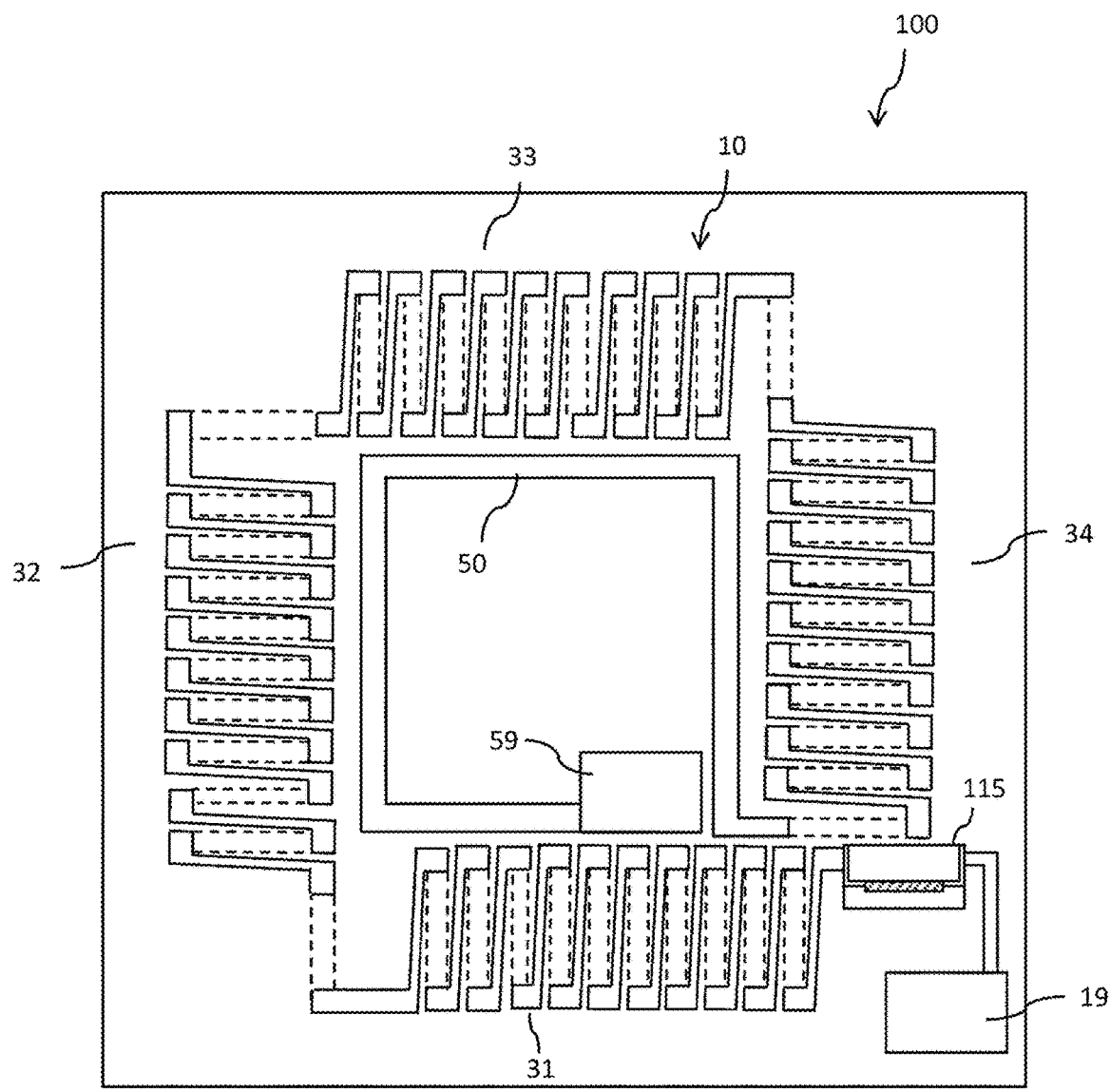
FIG. 15 is a plan view of the semiconductor device that can be used in the fourth embodiment of the present invention.

In the above embodiments, the winding return wire part 50 is provided outside the periphery of the winding wire part 10. In contrast, in the present embodiment, the winding return wire part 50 is provided inside the periphery of the winding wire part 10 as shown in FIG. 15. FIG. 15 corresponds to the first embodiment, and any configurations adopted in the above embodiments can also be adopted in the present embodiment. The members described in each of the above embodiments will be described with the same reference numerals.

Figure 14:
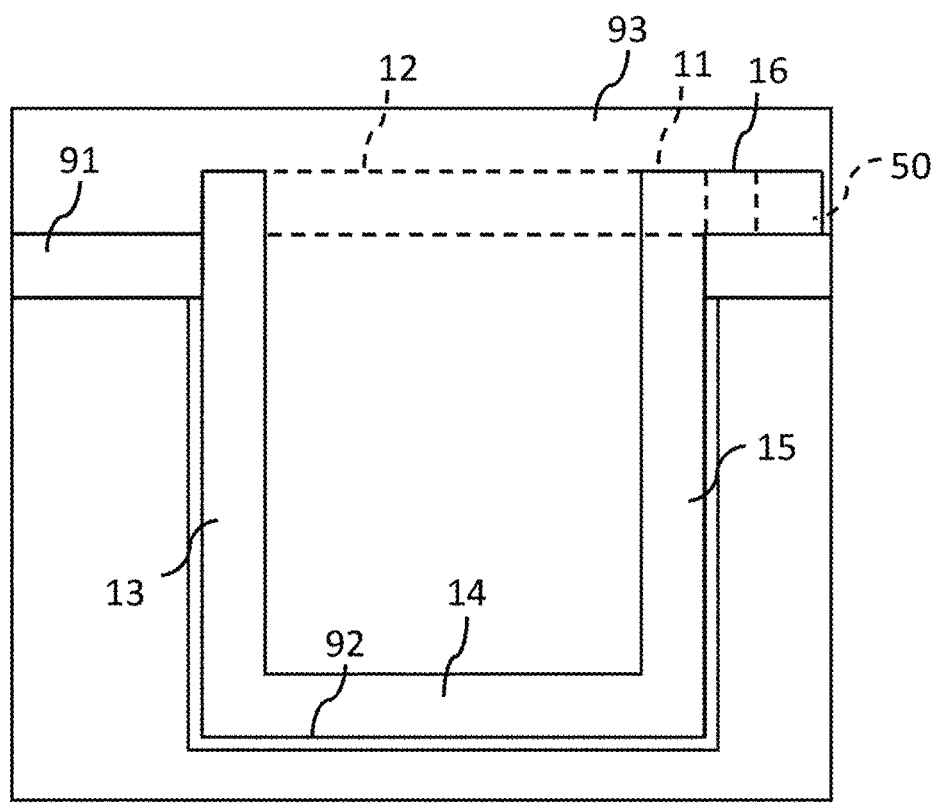
FIG. 14 is a longitudinal sectional view of a semiconductor device that can be used in a fourth embodiment of the present invention.

In the present embodiment, unlike the first embodiment, the winding wire part 10 may have: a first straight part 11 along a winding direction; a second straight part 12 extending from the end of the first straight part 11 toward the outer peripheral edge (to the left in FIG. 14) and extending in the plane direction along the winding direction; a third straight part 13 extending from one side toward the other side from the end of the second straight part 12; a fourth straight part 14 extending from the end of the third straight part 13 toward the inner peripheral edge (to the right in FIG. 14) and extending along the direction perpendicular to the winding direction; and a fifth straight part 15 extending toward one side from the other side from the end of the fourth straight part 14 (third aspect) (see FIG. 14). Further, a sixth straight part 16 extending from the end of the fifth straight part 15 toward the inner peripheral edge (to the right in FIG. 14) in the plane direction may be provided at the terminal end part of the winding wire part 10, and the end of the sixth straight part 16 and the starting end part of the winding return wire part 50 may be connected to each other. The winding return wire part 50 may extend in the plane direction.

Alternatively, unlike the aspect described above, the winding wire part 10 may have: a first straight part 11 along the winding direction; a second straight part 12 extending from the end of the first straight part 11 toward the outer peripheral edge and extending in the plane direction along the winding direction; a third straight part 13 extending toward one side from the other side from the end of the second straight part 12; a fourth straight part 14 extending from the end of the third straight part 13 toward the inner peripheral edge and extending along the direction perpendicular to the winding direction; and a fifth straight part 15 extending from one side toward the other side from the end of the fourth straight part 14 (fourth aspect). Further, a sixth straight part 16 extending from the end of the fifth straight part 15 toward the inner peripheral edge in the plane direction may be provided at the terminal end part of the winding wire part 10, and the end of the sixth straight part 16 and the starting end part of the winding return wire part 50 may be connected to each other. The winding return wire part 50 may extend in the plane direction.

Considering that the manufacturing method used in the first embodiment is adopted, it is advantageous to use the third aspect described first instead of the fourth aspect described later, because the winding return wire part 50 can be positioned on one side, which leads to a simplified manufacturing process.

When the present embodiment is used, the winding wire part 10 can be positioned outward of the periphery of the winding return wire part 50. Therefore, the length of the winding wire part 10 can be increased, and the number of turns of the winding wire part 10 can be increased. As a result, in some cases, the accuracy in detecting the change in current can be improved, which is advantageous.

Fifth Embodiment

Next, a fifth embodiment of the present invention will be described.

The above embodiments have described the aspect in which the winding wire part 10 has the A-direction winding wire part 31 extending in the second direction, the B-direction winding wire part 32 connected to the end of the A-direction winding wire part 31 and extending in the third direction, the C-direction winding wire part 33 connected to the end of the B-direction winding wire part 32 and extending in the second direction, and the D-direction winding wire part 34 connected to the end of the C-direction winding wire part 33 and extending in the third direction. However, the present invention is not limited thereto. As an example, each of the winding wire part 10 and the winding return wire part 50 may have a circular shape in a plan view (in a plane including the second direction and the third direction) as shown in FIG. 16. Alternatively, each of the winding wire part 10 and the winding return wire part 50 may have a triangular shape in a plan view. For the other configurations, any configurations adopted in the above embodiments can also be adopted in the present embodiment. The members described in each of the above embodiments will be described with the same reference numerals.

When the aspect shown in FIG. 16 is adopted, balanced detection of the current flowing between the first electrode 61 and the second electrode 62 can be expected. In view of facilitating the manufacturing process, it is advantageous to use an aspect in which straight shaped parts such as the A-direction winding wire part 31, the B-direction winding wire part 32, the C-direction winding wire part 33, and the D-direction winding wire part 34 as in the first and second embodiments are joined to each other.

Sixth Embodiment

Next, a sixth embodiment of the present invention will be described.

In the above embodiments, the winding wire part 10 and the winding return wire part 50 are both provided in one semiconductor layer 1. In contrast, in the present embodiment, only the winding wire part 10 is provided in the semiconductor layer 1 provided with the first electrode 61 and the second electrode 62, and the winding return wire part 50 is provided on another semiconductor layer 200 or another member. For the other configurations, any configurations adopted in the above embodiments can also be adopted in the present embodiment. The members described in each of the above embodiments will be described with the same reference numerals.

As an example, the winding return wire part 50 may be made of a metal wire, and may be arranged to surround the periphery of the semiconductor device 100 as shown in FIG. 17(*a*). In this case, a groove 5 may be provided on the side wall of the semiconductor device 100 for positioning the winding return wire part 50.

Alternatively, as shown in FIG. 17(*b*), the winding return wire part 50 may be formed in a semiconductor layer 200 different from the semiconductor layer 1 provided with the winding wire part 10, and the semiconductor layer 200 may be provided to surround the semiconductor layer 1 provided with the winding wire part 10.

Seventh Embodiment

Next, a seventh embodiment of the present invention will be described.

In the above embodiments, one quasi Rogowski coil or Rogowski coil is provided. In contrast, in the present embodiment, a plurality of quasi Rogowski coils or Rogowski coils are provided. For the other configurations, any configurations adopted in the above embodiments can also be adopted in the present embodiment. The members described in each of the above embodiments will be described with the same reference numerals.

Figure 18:
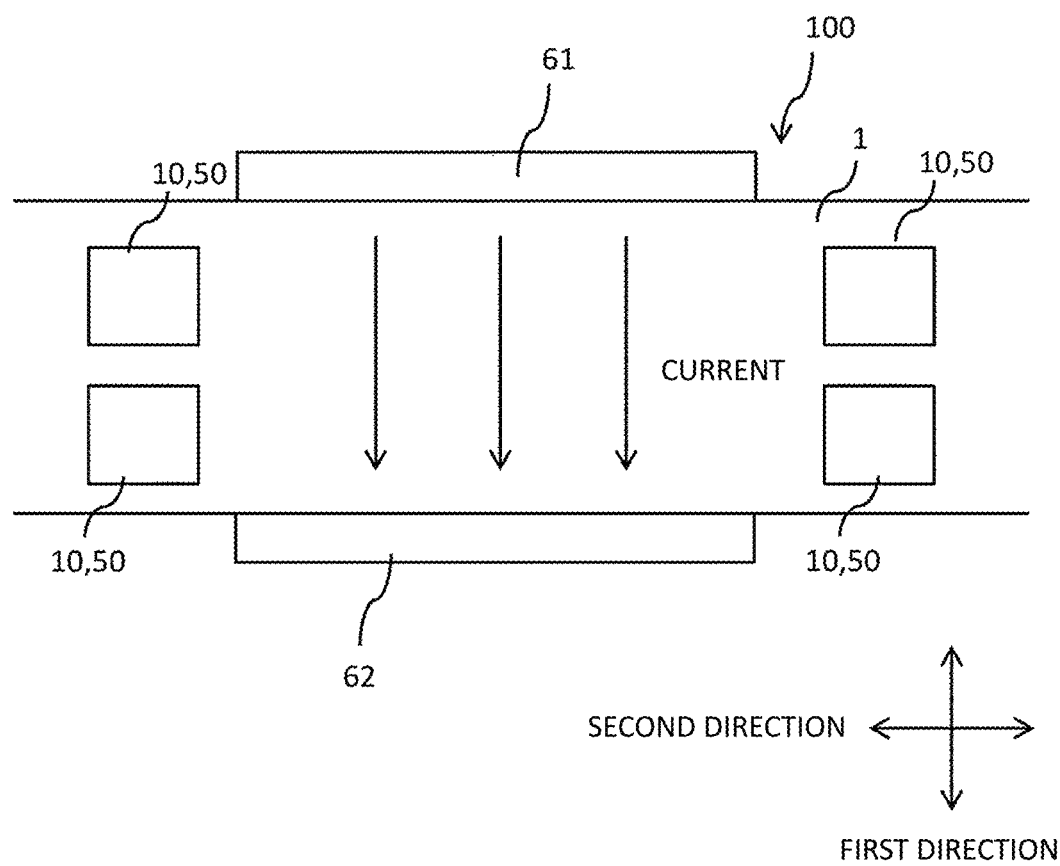
FIG. 18 shows a longitudinal cross section of a semiconductor device that can be used in a seventh embodiment of the present invention.

As shown in FIG. 18, quasi Rogowski coils or Rogowski coils may be aligned in the first direction. More specifically, the winding wire part 10 and the winding return wire part 50 which does not pass through the winding wire part 10 (a quasi Rogowski coil), or the winding wire part 10 and the winding return wire part 50 passing through the winding wire part 10 (Rogowski coil) may be aligned in the first direction. When this aspect is adopted, a change in current can be detected at two or more locations in the first direction, which is advantageous in that a change in current can be detected more accurately. However, in this aspect, it should be noted that, since the winding wire part 10 and the winding return wire part 50 need to be arranged so as to be stacked in the first direction, the manufacturing process becomes complicated as compared with the first embodiment.

Figure 19:
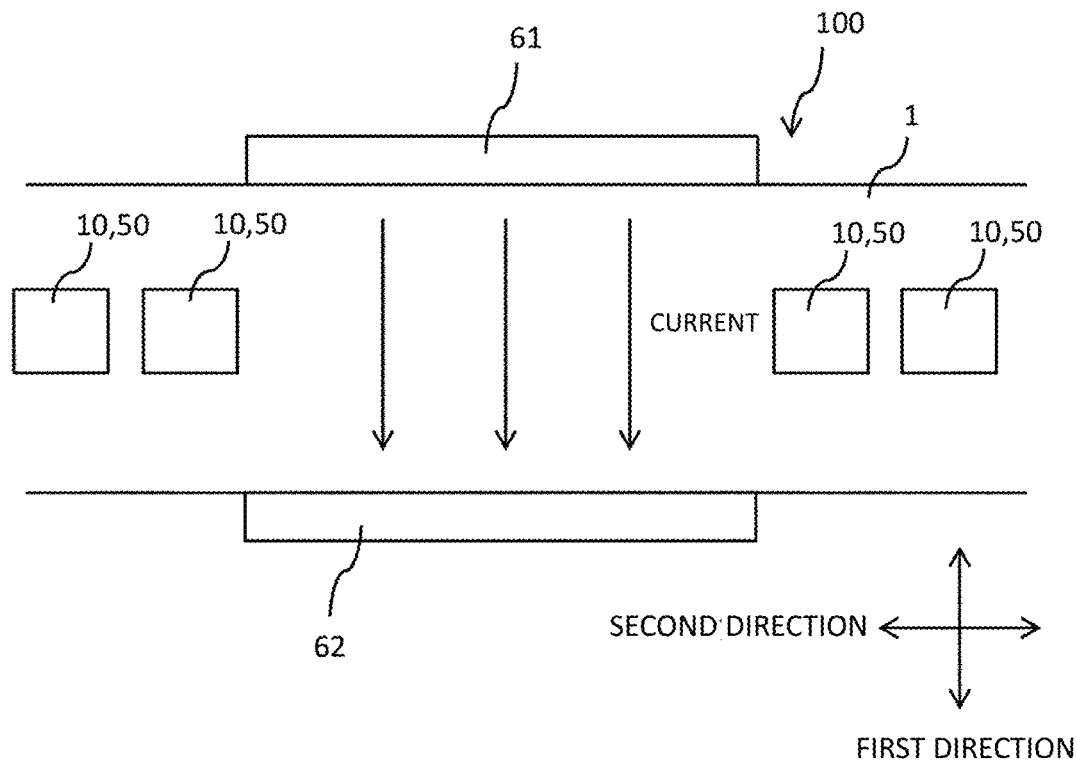
FIG. 19 shows a longitudinal cross section of a semiconductor device that can be used in another aspect of the seventh embodiment of the present invention.

As shown in FIG. 19, another quasi Rogowski coil or Rogowski coil may be disposed on the outer peripheral side of the quasi Rogowski coil or Rogowski coil. More specifically, the winding wire part 10 and the winding return wire part 50 which does not pass through the winding wire part 10 (quasi Rogowski coil), or the winding wire part 10 and the winding return wire part 50 passing through the winding wire part 10 (Rogowski coil) may be aligned in the second direction or the third direction. When this aspect is adopted, a change in current can also be detected more accurately, which is advantageous. In addition, this aspect is also advantageous in that the same manufacturing process as that of the first embodiment can be employed.

Figure 20:
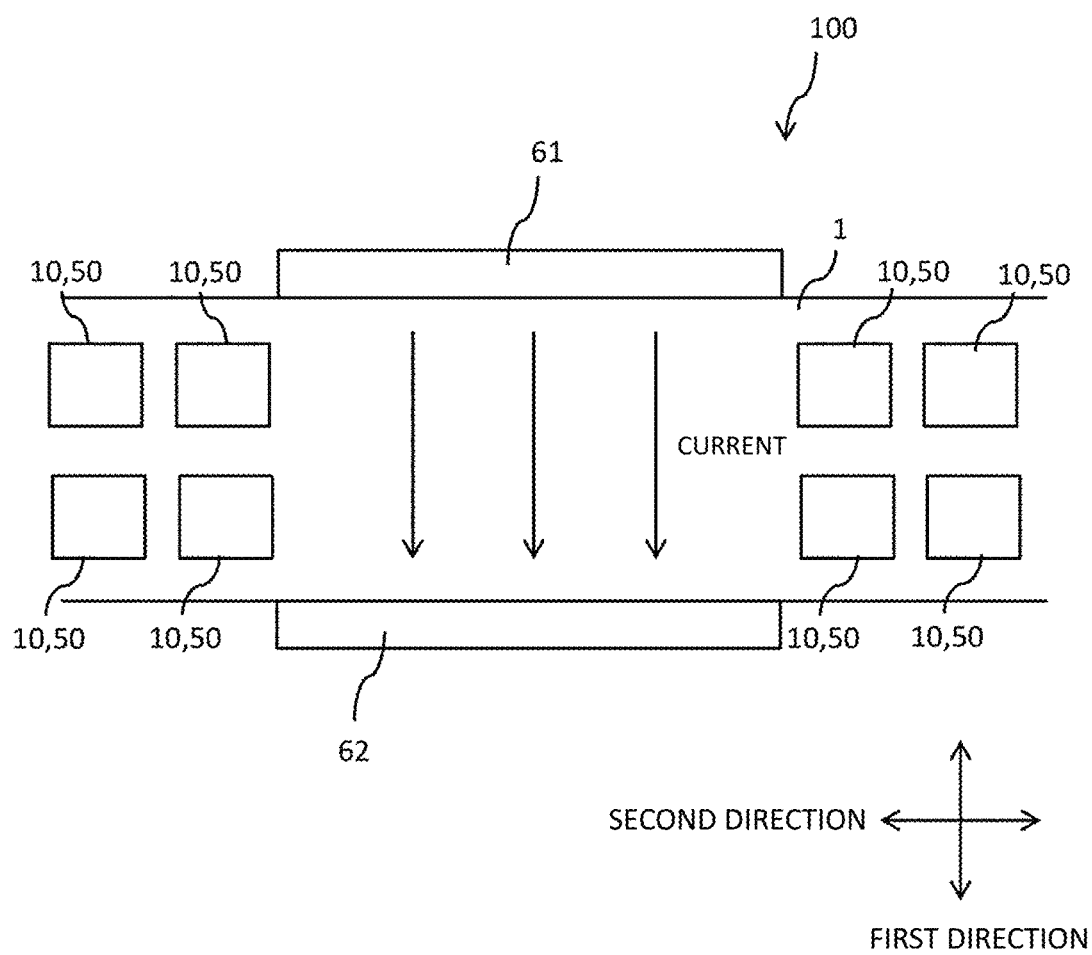
FIG. 20 shows a longitudinal cross section of a semiconductor device that can be used in still another aspect of the seventh embodiment of the present invention.

These aspects may be combined, and as shown in FIG. 20, the quasi Rogowski coils or Rogowski coils may be stacked in the first direction, and other quasi Rogowski coils or Rogowski coils may be provided on the outer peripheral side of the quasi Rogowski coils or Rogowski coils. More specifically, the winding wire parts 10 and the winding return wire parts 50 which do not pass through the winding wire parts 10 (quasi Rogowski coils), or the winding wire parts 10 and the winding return wire parts 50 passing through the winding wire parts 10 (Rogowski coils) may be aligned in the second direction or the third direction, and also aligned in the first direction.

Eighth Embodiment

Next, an eighth embodiment of the present invention will be described.

In the above embodiments, the winding wire part 10, the winding return wire part 50, and the like are provided in the semiconductor device 100. In contrast, in the present embodiment, the winding wire part 10, the winding return wire part 50, and the like are provided in a semiconductor component 150 different from the semiconductor device 100. The other configurations are similar to those of the above embodiments, and any configurations adopted in the above embodiments can be adopted in the present embodiment. In the aspect of the present embodiment, the semiconductor layer 1 of the semiconductor component 150 is provided with a resistance part 115 or a capacitor part 125, or both of the resistance part 115 and the capacitor part 125.

When the semiconductor component 150 as in the present embodiment is used, a change in current can be measured for an existing semiconductor device 100 as well, which is advantageous.

For example, the semiconductor component 150 according to the present embodiment may be arranged so as to surround the periphery of the semiconductor device 100 to be measured as shown in FIG. 21. The present embodiment is not limited thereto, and the semiconductor component 150 according to the present embodiment may be provided so as to surround a detection target through which at least a portion of the current flowing in the semiconductor device 100 flows. When the aspect described above is employed, a current flowing through the semiconductor device 100 can be indirectly measured, even if it is difficult to directly measure the current flowing through the semiconductor device 100 due to the positional relationship or the like, and thus, this aspect is advantageous in this point.

Figure 22:
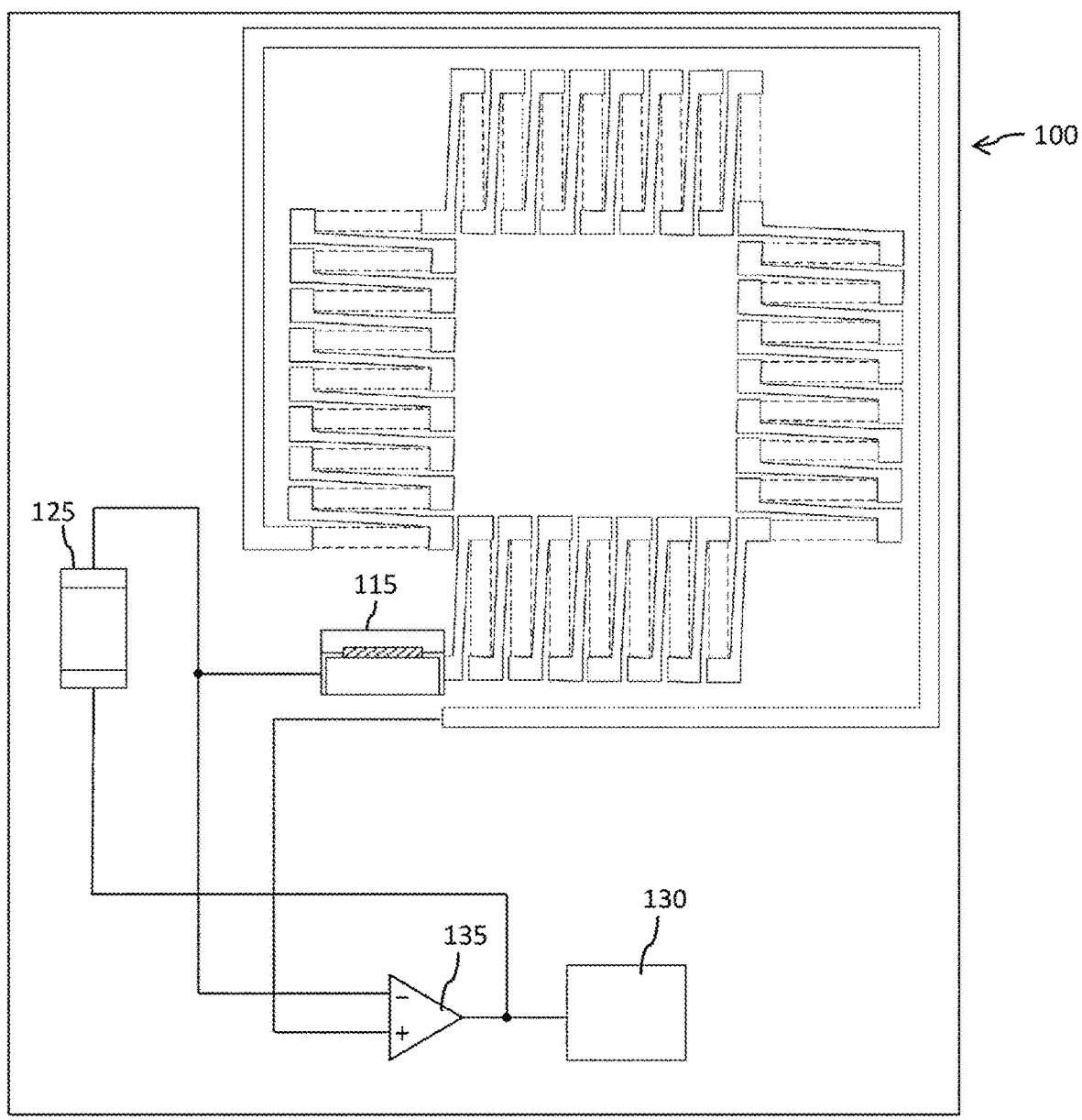
FIG. 22 is a plan view of a semiconductor device that can be used in a ninth embodiment of the present invention.

Although the above embodiments have been described using the aspect in which the operational amplifier 130 is provided outside, the present invention is not limited thereto, and the operational amplifier part 135 may be formed in the semiconductor layer 1 as shown in FIG. 22 (ninth embodiment). In the case where the resistance part 115, the capacitor part 125, and the operational amplifier part 135 are formed in the semiconductor layer 1, an integration circuit can be formed by these units. Therefore, a change in current can be detected only by the semiconductor device 100, which is advantageous.

The foregoing descriptions of the embodiments and the disclosure of the drawings are merely one example for describing the present invention recited in the claims. The present invention recited in the claims shall not be limited by the foregoing descriptions of the embodiments and the disclosure of the drawings. Further, the recitations of the claims at the time of the filing of the present application are merely an example, and the recitations of the claims can be changed as appropriate based on the description of the specification, the drawings, and the like.

Figure 23:
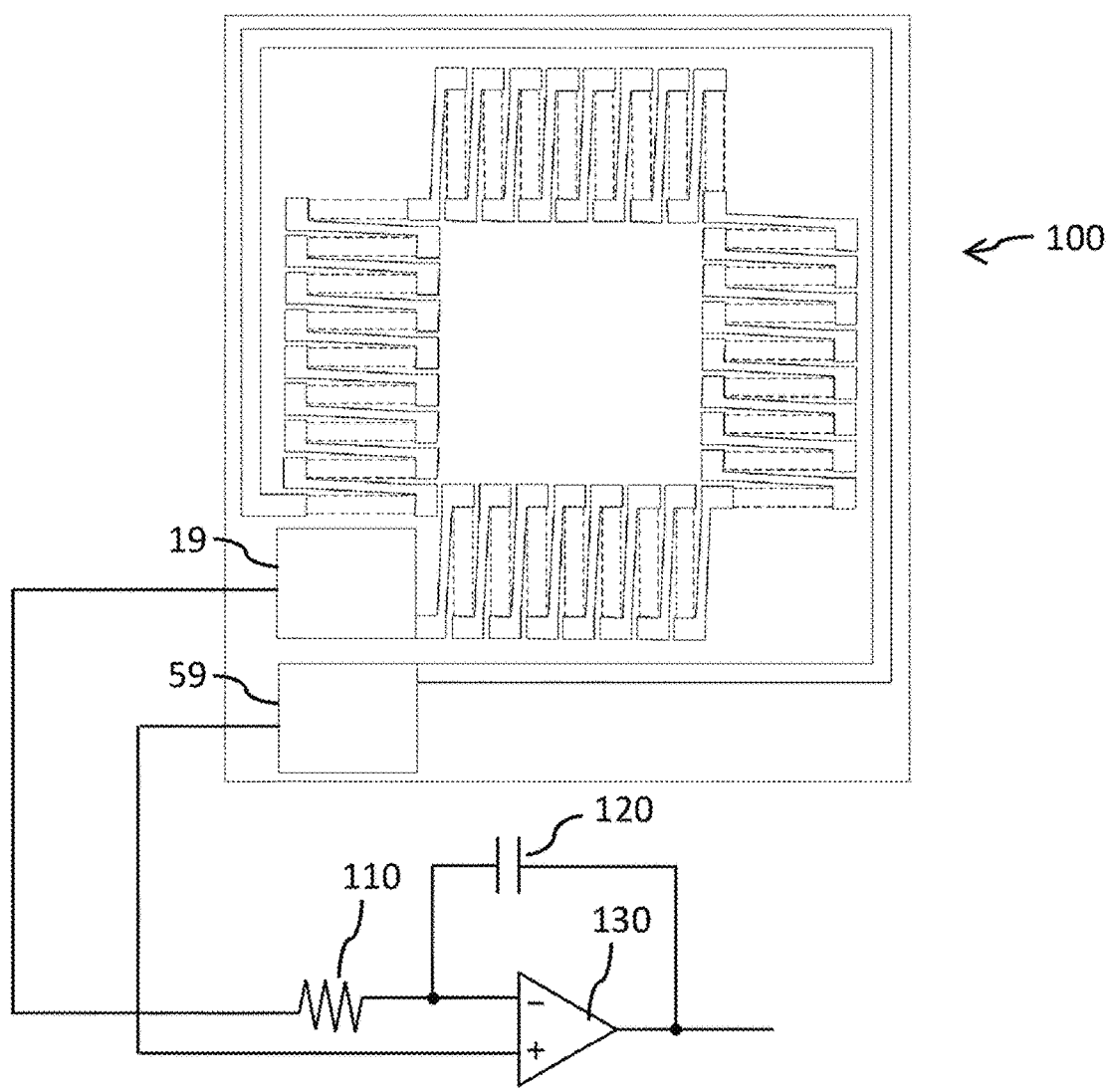
FIG. 23 is a plan view of a semiconductor device that can be used in the present invention.

The above embodiments have been described using the aspect in which at least one of the resistance part 115 and the capacitor part 125 is formed in the semiconductor layer 1. However, the present invention is not limited thereto. As shown in FIG. 23, the winding return wire part 50 and the winding wire part 10 in the semiconductor layer 1 may be connected to the resistor 110, the capacitor 120, and the operational amplifier 130, which are provided outside of the semiconductor device 100, to form an integration circuit.

REFERENCE SIGNS LIST 1 semiconductor layer
10 winding wire part
50 winding return wire part
61 first electrode
62 second electrode
100 semiconductor device
150 semiconductor component
110 resistor
115 resistance part
120 capacitor
125 capacitor part
130 operational amplifier
135 operational amplifier part

The invention claimed is:

1. A semiconductor device comprising:
a first electrode;
a second electrode; and
a semiconductor layer having a winding wire part provided so as to surround a current flowing between the first electrode and the second electrode, a winding return wire part which is provided so as to surround the current, is connected to a terminal end part of the winding wire part and returns toward a starting end part side from the terminal end part, and an integration circuit configuration part connected to the winding wire part or the winding return wire part; wherein
the integration circuit configuration part has one or more of a resistance part, a capacitor part and an operational amplifier part,
the resistance part is electrically connected to the winding wire part or the winding return wire part,
the capacitor part is electrically connected to the resistance part or a resistor provided outside, and
the operational amplifier part is electrically connected to the resistance part or a resistor provided outside, and the capacitor part or a capacitor provided outside.

2. The semiconductor device according to claim 1, wherein
the integration circuit configuration part has the resistance part.

3. The semiconductor device according to claim 1, wherein
the integration circuit configuration part has the capacitor part.

4. The semiconductor device according to claim 1, wherein
the integration circuit configuration part has the resistance part and the capacitor part, and
the resistance part and the capacitor part are electrically connected to an operational amplifier provided outside.

5. The semiconductor device according to claim 1, wherein
the integration circuit configuration part has the resistance part, the capacitor part and the operational amplifier part.

6. The semiconductor device according to claim 1, wherein
the winding return wire part does not pass through the winding wire part.

7. A semiconductor component comprising a semiconductor layer, wherein
the semiconductor layer has
a winding wire part provided so as to surround a current;
a winding return wire part which is provided so as to surround the current, is connected to a terminal end part of the winding wire part and returns toward a starting end part side from the terminal end part; and
an integration circuit configuration part connected to the winding wire part or the winding return wire part;
the integration circuit configuration part has one or more of a resistance part, a capacitor part and an operational amplifier part,
the resistance part is electrically connected to the winding wire part or the winding return wire part,
the capacitor part is electrically connected to the resistance part or a resistor provided outside, and
the operational amplifier part is electrically connected to the resistance part or a resistor provided outside, and the capacitor part or a capacitor provided outside.

* * * * *